US006961871B2

(12) United States Patent
Danialy et al.

(10) Patent No.: US 6,961,871 B2
(45) Date of Patent: Nov. 1, 2005

(54) METHOD, SYSTEM AND PROGRAM PRODUCT FOR TESTING AND/OR DIAGNOSING CIRCUITS USING EMBEDDED TEST CONTROLLER ACCESS DATA

(75) Inventors: Givargis A. Danialy, San Jose, CA (US); Stephen V. Pateras, San Jose, CA (US); Michael C. Howells, San Jose, CA (US); Martin J. Bell, Santa Clara, CA (US); Charles Mc Donald, San Jose, CA (US); Stephen K. Sunter, Nepean (CA)

(73) Assignee: LogicVision, Inc., San Jose, CA (US)

( * ) Notice: Subject to any disclaimer, the term of this patent is extended or adjusted under 35 U.S.C. 154(b) by 708 days.

(21) Appl. No.: 09/954,078

(22) Filed: Sep. 18, 2001

(65) Prior Publication Data

US 2002/0073374 A1 Jun. 13, 2002

(30) Foreign Application Priority Data

Sep. 28, 2000 (CA) .............................................. 2321346

(51) Int. Cl.⁷ .............................................. G06F 11/00
(52) U.S. Cl. ............................. 714/30; 714/33; 714/37; 714/39
(58) Field of Search .............................. 714/30, 32, 33, 714/37, 39

(56) References Cited

U.S. PATENT DOCUMENTS

| | | | | |
|---|---|---|---|---|
| 4,766,595 A | * | 8/1988 | Gollomp ..................... 714/33 |
| 5,111,402 A | * | 5/1992 | Brooks et al. ................ 701/35 |
| 5,202,889 A | | 4/1993 | Aharon et al. | |
| 5,282,146 A | | 1/1994 | Ahara et al. | |
| 5,377,203 A | | 12/1994 | Khan | |
| 5,497,079 A | | 3/1996 | Yamada et al. | |
| 5,539,652 A | | 7/1996 | Tegethoff | |
| 5,586,319 A | | 12/1996 | Bell | |
| 5,682,392 A | * | 10/1997 | Raymond et al. ........... 714/727 |
| 5,745,501 A | | 4/1998 | Garner et al. | |
| 5,801,972 A | | 9/1998 | Konno | |
| 5,815,513 A | | 9/1998 | Hiraide | |
| 6,014,033 A | | 1/2000 | Fitzgerald et al. | |
| 6,061,283 A | | 5/2000 | Takahashi et al. | |
| 6,114,870 A | | 9/2000 | Vogley | |
| 6,681,359 B1 | * | 1/2004 | Au et al. ..................... 714/733 |
| 6,687,865 B1 | * | 2/2004 | Dervisoglu et al. ......... 714/726 |
| 6,691,269 B2 | * | 2/2004 | Sunter ........................ 714/727 |
| 6,757,837 B1 | * | 6/2004 | Platt et al. ...................... 714/4 |

OTHER PUBLICATIONS

Marinissen, E.J., et al.: "Towards a Standard for Embedded Core Test: An Example"; Proceedings of the International Test Conference, 1999. Atlantic City, NJ, Sep. 28–30, 1999.
Marinissen, E.J., et al.: "The Role of Test Protocols in Testing Embedded–Core–Based System ICs"; Test Workshop 1999. Proceedings European, Constance, Germany, May 25–28, 1999, Los Alamitos, CA, USA, IEEE Comput. Soc, US. May 25, 1999, pp. 70–75.
Whol P. et al.: "A Unified Interface for Scan Test Generation Based on Stil", Proceedings of the International Test Conference, 1997, Nov. 1–6, 1997, Washington, DC, USA, pp. 1011–1019.
Taylor T.: "A Standard Test Interface Language (STIL), Extending the Standard", Proceedings of the International Test Conference, 1998, Oct. 19–20, 1998.

* cited by examiner

*Primary Examiner*—Nadeem Iqbal
*Assistant Examiner*—Timothy M. Bonura
(74) *Attorney, Agent, or Firm*—Eugene E. Prouix

(57) ABSTRACT

A software and hardware system and an associated methodology provides ATE-independent go/no-go testing as well as advanced failure diagnosis of integrated circuits for silicon debug, process characterization, production (volume) testing, and system diagnosis comprises an embedded test architecture designed within an integrated circuit; means for seamlessly transferring information between the integrated circuit and its external environment; and an external environment that effectuates the seamless transfer for the user to perform relevant test and diagnosis.

90 Claims, 10 Drawing Sheets

```
1   Test Specification Configuration File
2   TestConfiguration ( testConfigurationName) {
3   TestGroup ( Group 1) {
4   TestStep ( TestStep 1) {
5   ATEClockPeriod: rTime[ s | ( ms) | us | ns | ps];
6   TCKRatio: 1 | 4 | 8 | ( 16) | 32;
7   SystemClockSource: Functional | TCK |
8   System | System_2 | System_4 |
9   SystemPLL | SystemPLL_2 | SystemPLL_4;
10  GenerateSysClocks: ( On) | Off;
11  SetupRate: SysClock | TCK;
12  UserIRBITn: On | ( Off);
13  UserDRBitn: On | ( Off);
14  ForceDisable: On | (Off);
15  InitialWaitCycles: numCycles;
16  Pause: pauseTime[ s | ( ms) | us | ns | ps];
17  PowerLevel: ( Full)| P7_8| P3_4| P5_8| P1_2| P3_8| P1_4| P1_8;
18  FlushTest: On | ( Off); 18
19  MemoryController ( moduleName | BP x | DP x ) { //memory Test Controller
20  CompareGo: On | ( Off);
21  CompareMisr: On | (Off);
22  CompStatIDSelect: comparatorNum;
23  DynamicRetentionTest:On | ( Off);
24  DynamicRetentionTime:rTime[ s | ( ms) | us | ns | ps];
25  FreezeControllerStep: On | ( Off);
26  ControllerStepNumber: controllerStepNum;
27  MemoryReset:On | ( Off);
28  StaticRetentionTest: On | (Off);
29  StaticRetentionTime: rTime[ s | ( ms) | us | ns | ps];
30  AlgorithmPhase:( AllPhases) | BeginToPause |
31  PauseToPause | PauseToEnd;
32  } // End of MemoryController
33  . // Repeat all memory BIST controllers to be run in the same TestStep
34  } // End TestStep 1
35  TestStep ( TestStep 2) {
36  . // See previous TestStep properties
37  .
38  LogicController ( moduleName | BP x | DP x ) { //logic Test Controller
39  StartTrial: startNum;
40  EndTrial: endNum;
41  }
42  . // Repeat all logic BIST controllers to be run in the same TestStep
43  } // End TestStep
44  . // Repeat for all TestSteps.
45  } // End TestGroup
46  . // Repeat for all TestGroups
47  } // End TestConfiguration
```

FIG. 2.

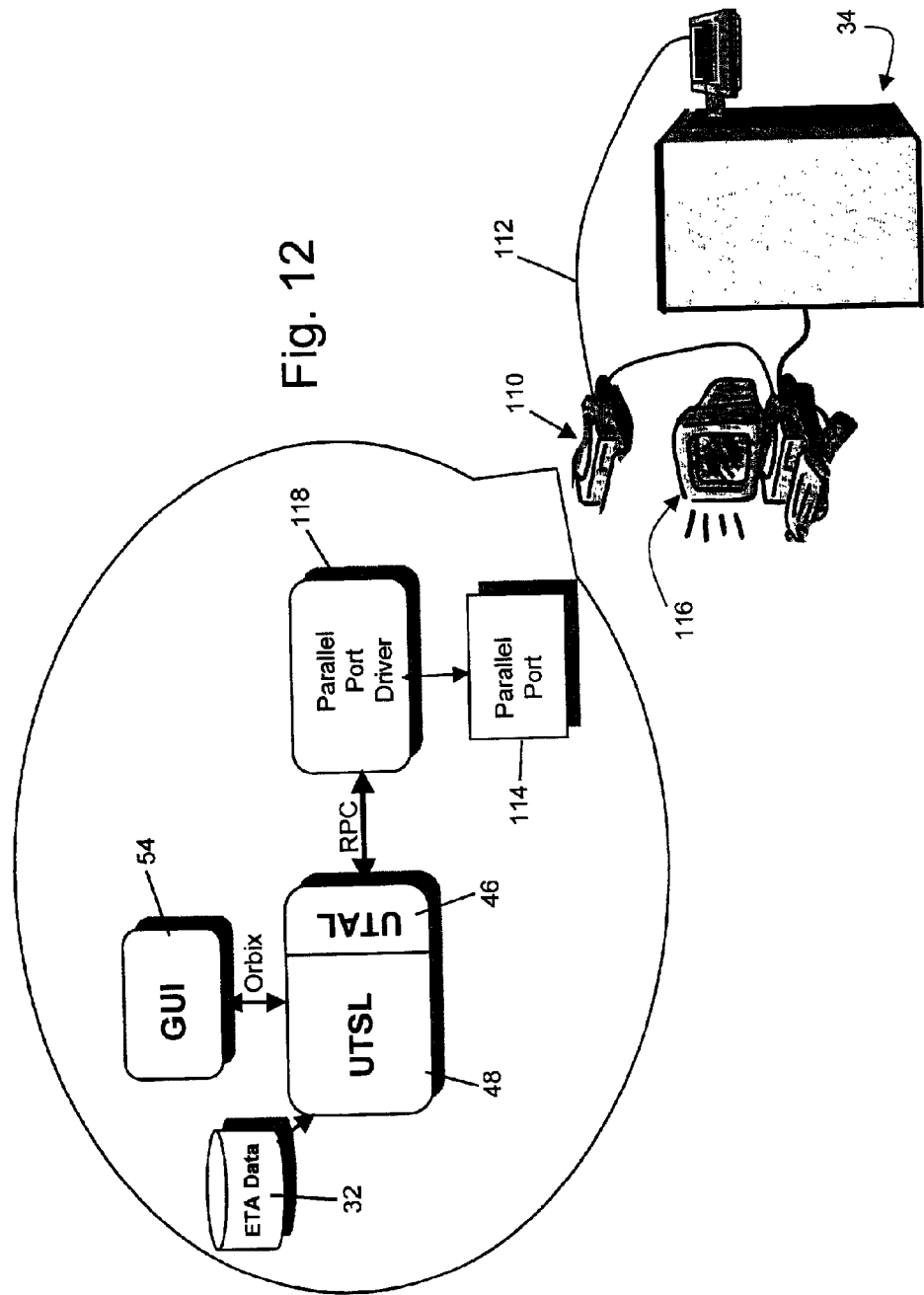

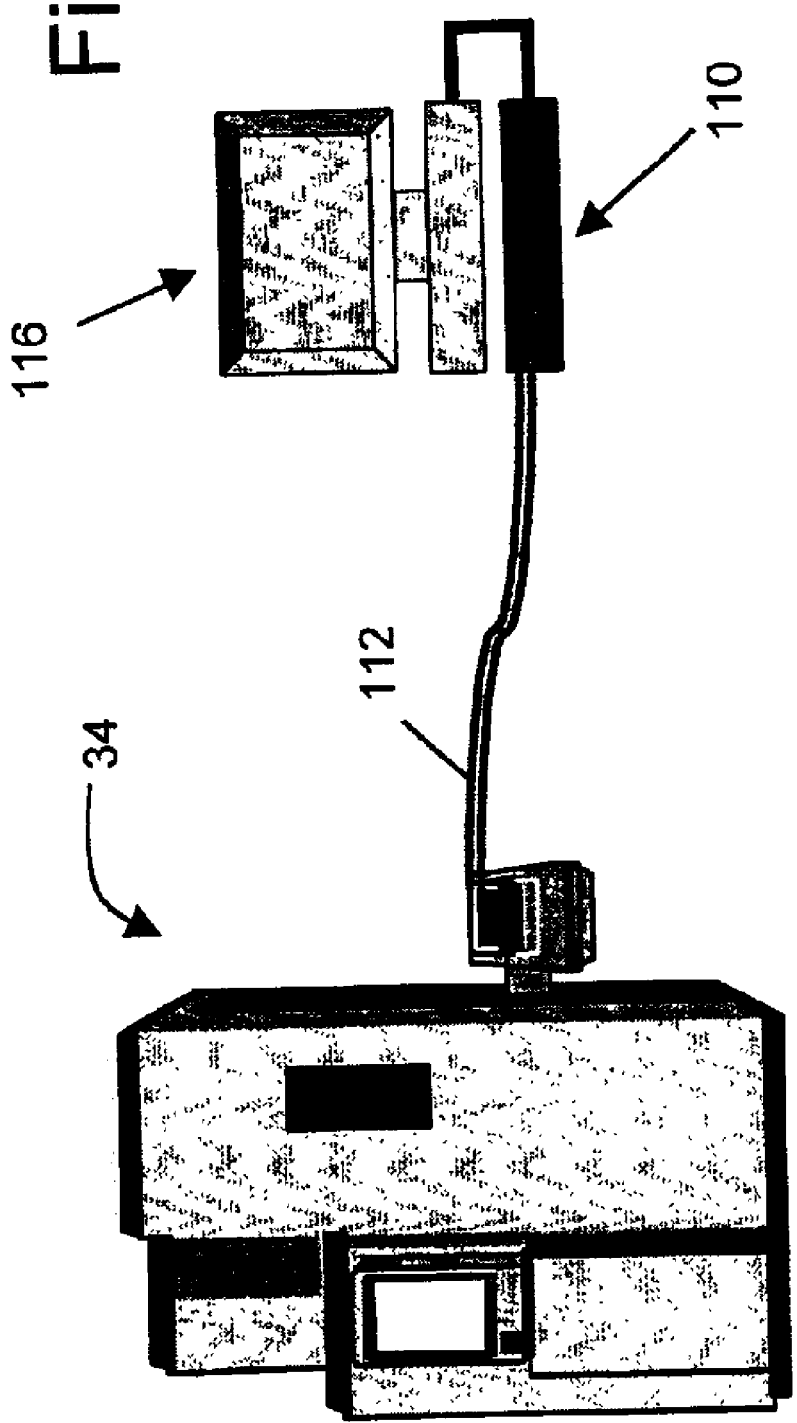

METHOD, SYSTEM AND PROGRAM PRODUCT FOR TESTING AND/OR DIAGNOSING CIRCUITS USING EMBEDDED TEST CONTROLLER ACCESS DATA

The present invention generally relates to the design and testing of integrated circuits and, more specifically, to a system, program product and method for use in facilitating testing of integrated circuits with embedded test controllers in both the design and manufacturing test environments.

BACKGROUND OF THE INVENTION

The manufacturing test flow has historically been challenged by the separation between the integrated circuit design and manufacturing test communities. Design engineers typically create test patterns for the design of an integrated circuit and send these to the test engineers. The test engineers incorporate these test patterns into an overall test program to be loaded into and executed by Automated Test Equipment (ATE). The automated test equipment generally comprises a computer software controlled tester in which a device under test is mounted. A number of ATEs are commercially available, many operating on different operating system platforms with different instructions sets and formats. Thus, the handoff between the design engineer and the manufacturing test engineer can be difficult because the test patterns must be translated into a format understood by the ATE. In addition, when failures occur, the test engineer often needs to consult with the design engineer and the device design data for proper diagnosis.

This communication and consultation between design engineers and test and production engineers is exacerbated because of strong dependence on specific commercial ATE architectures, their proprietary operating system and operational characteristics. In turn, this creates a manufacturing test environment that is extremely resource intensive and that significantly affects time-to-market, time-to-volume, and quality of an integrated circuit.

While embedded test architectures have been proposed that enables significant reduction of test vector and test program preparation for production go/no-go testing, no test result data is typically available for diagnostic analysis. The diagnosis issue is especially important when Built-In Self-Test (embedded test) is part of the test methodology. Since built-in self-test tests are self-contained, no test result data is typically available for diagnostic analysis beyond gross go/no-go reporting. Therefore, to obtain greater diagnostic resolution, the embedded test blocks must be run several times on a "batch" basis, with each run using different test patterns and/or embedded test operating modes to obtain additional diagnostic information. In many cases, the setup requirements for each embedded test run depend on the results of one or more of the previous runs. This means that the test engineer, or, more often, the design engineer cannot create test programs in advance to diagnose failures but must do so while the diagnosis is taking place.

In summary, there is a need for an generic test environment that is based on a seamless transfer and synthesis of information between design engineers and test and production engineers and which facilitates the development of test programs and the diagnosing test results.

SUMMARY OF THE INVENTION

The present invention provides a software system and method that provides seamless integration of embedded test controller testing within a conventional ATE environment, as well as non-ATE environments. The system removes the need for conventional batch oriented test pattern generation described above and reduces, if not eliminates, the reliance of the test engineer on the design community.

This is accomplished, in part, by providing an embedded test access data file for the integrated circuit device under development, the data file containing all of the information about the embedded test blocks that is needed to execute the embedded test controllers and diagnose test results, and, in part, by providing a system which is capable of autonomously performing tests and diagnosis on any one or more of the test controllers based on a relatively simple user defined test configuration. A further aspect of the invention relates to the provision of a user interface which reads the access data file and displays, the test controllers contains in the device under tests and runtime parameters associated with each controller and enables the user to specify a sequence of test steps involving one or more of the test controllers in parallel or in sequence. This results in a vectorless handoff between design and manufacturing test.

The system of the present invention supports the needs of each of the test program developer, the manufacturing test personnel, and the product support engineer. The integration of an embedded test access system with the ATE operating system allows these users to work in an environment most suitable to their operation. The test engineer works with the embedded test access software as he would with any of the other available test program creation tools. For the manufacturing personnel, a final test configuration fits into the test production flow no differently than any other test program ready for go/no-go testing. A product support engineer can set up the system to monitor failure mechanisms and call special diagnosis routines to pin point failures down to the flip-flop for logic devices and to the cell for memory devices.

One aspect of the present invention is generally defined as a method, system and program product for testing a circuit having one or more embedded test controllers, comprising reading a test controller access data identifying all test controllers embedded in said device and describing data required for initializing, executing and extracting test data from said test controllers; reading test configuration data describing one or more test steps to be performed on one or more test controllers embedded in said device; converting the test configuration data to a sequence of test patterns for performing each of the one or more test steps, including extracting from the access data file data required for initializing, executing and extracting test response data from each of the one or more test controllers; and loading the sequence of test patterns into said one or more test controllers in said integrated circuit.

Another aspect of the present invention is generally defined as a method, system and program product of diagnosing test response data from a test performed on a circuit having embedded test controllers therein, the method comprising, for each module failure representing a miscompare in execution of a test pattern loaded into a test controller, determining the pin name and cycle offset of the pin from the beginning of the test pattern; determining from a backmap data file for the cycle, the identity of a generic formatted command that generated the compare pattern for the cycle that resulted in the failure; using the identity of failing the generic command and failing bit offset within that command, determining an original command in the backmap data file and the failing bit offset in embedded test register data annotated in the backmap associated with the generic command; analyzing failing register bit against said access data file for the embedded test controller associated with the pin to generate a description of the failure and a datalog report in the context of the design of said circuit.

A still further aspect of the present invention is generally defined as a system and program product for use in testing or diagnosing an electronic system having embedded test controllers therein, comprising first means for creating information about the test capabilities of the embedded test controllers in the electronic system; second means for generating test and/or diagnostic instructions and data for the test controllers in the electronic system; third means for applying the instructions and data to the test controllers and receiving test results therefrom; and fourth means for analyzing test result data from the test controllers and reporting characteristics of the electronic system.

BRIEF DESCRIPTION OF THE DRAWINGS

These and other features and aspects of the invention will become more apparent from the following description in which reference is made to the appended drawings in which:

FIG. 2 illustrates the general structure and syntax of a test configuration file according to one embodiment of the present invention;

FIGS. 12 and 13 are views diagrammatically illustrating an embodiment of the present invention in which a computer system, in the program product of the present invention is loaded, is connected directly to the JTAG pins of a device under test which, in turn, is mounted on a tester head of an ATE tester.

DETAILED DESCRIPTION OF PREFERRED EMBODIMENTS

Figure 1:
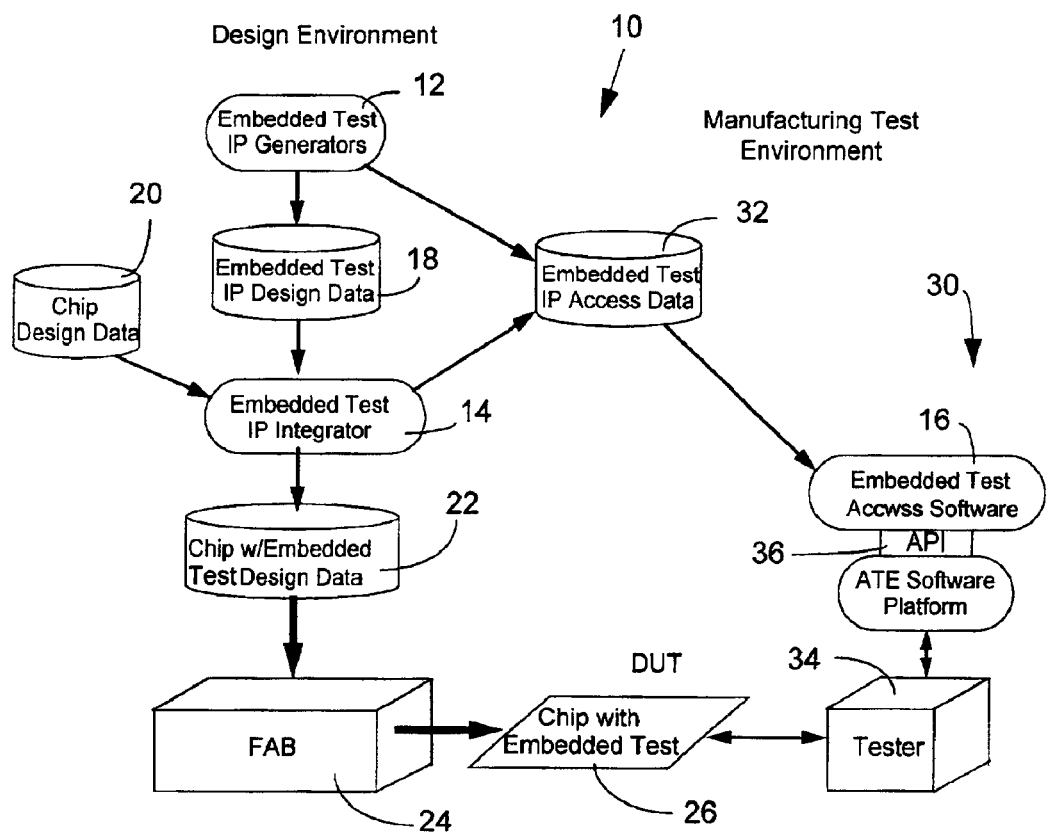
FIG. 1 is a block diagram which diagrammatically illustrates the flow of a system architecture according to one embodiment of the present invention.

By way of overview, the present invention provides novel methods of testing and diagnosing faults in integrated circuits and a computer program product and system for automating the methods. In accordance with the invention, detailed data respecting the test controllers embedded in a device under test is stored in a computer readable database. The database may take any suitable form including one or more computer readable files. Hereinafter, the database will be referred to as an embedded test access file or ETA file. The program product of the present invention is hereinafter referred to as embedded test access software or ETA software. The invention also provides a system which employs a relatively simple user defined test configuration for performing user defined tests and diagnosis as well as a user interactive interface for producing a test configuration and storing the test configuration in a computer readable file. The description below describes the contents of these files in more detail.

Another aspect of the invention relates to the provision of a first library of programs which provide the desired methodology and functionality of the invention and, more specifically, the ability to read the ETA file and use the contents of the file to generate and save the test configuration file, translate each test specification in the test configuration file to one or more sequence test instructions to perform tests on the device under test, execute the test instructions and diagnose test results.

Another aspect of the invention relates to the provision of a second library of programs for translating the test instructions produced by the first library to a machine specific format and applying the machine specific instructions to the machine to which the device under test is connected. The second library is also operable to translate test result data output by the machine to a generic format to allow the first library to diagnose the test results.

As mentioned above, the ETA software is also designed to diagnose test failures with the level of diagnosis ranging from a simple pass/fail to identification of the failing module. In performing the diagnosis, the system accesses the ETA file to determine correct response data for the specified test and uses this data to identify a failing module. The system can be run interactively by means of a user interface or independently of user intervention.

In a specific embodiment of the invention described herein, the aforementioned machine is an ATE-tester. However, the invention contemplates application of the method and system to other environments. In addition, while the specific embodiments described herein indicates that the ETA software is loaded on an ATE system, it is to be understood that the software need not be so intimately associated with such a system. Indeed, the invention contemplates the software being located remotely from a device to be tested and connecting with the device using means such as a local area network, internet, intranet, dial-up and like connections for communicating with the device under test. The system merely requires the aforementioned ETA data files for each device to be tested. The invention not only contemplates testing or specific devices, but also contemplates testing of circuit boards and systems.

Embedded Test Controllers

Before describing the invention in further detail, it would be useful briefly describe embedded test controllers and terminology associated therewith.

An embedded test block or test structure is generally defined as a built-in self-test or embedded test controller and associated testable modules arranged in predetermined scan chains in an integrated circuit device. A testable module is a single hardware entity embedded in the device to be tested. A module may be a piece of combinational logic, an embedded memory, a mixed signal component and the like. An embedded test controller is a circuit designed to test one or more modules of the same type, i.e. logic or memory, in parallel or sequentially. Embedded test controllers have runtime control options or parameters which are used to generate test vectors for a test. These options differ depending on the type of controller. For example, "retention time" may be specified for a memory type embedded test controller and "power level" may be specified for a logic type embedded test controller. Single stepping an embedded test controller is an operation which is performed for a diagnostic purpose. A single step for a logic type embedded test controller is referred to as a "trial", while that for a memory type embedded test controller is referred to as a "step".

Test controllers are caused to execute by serially loading test patterns into the controllers, with the patterns specifying the desired runtime parameters. When so instructed, the test controller performs a test of the testable modules associated with it. The manner in which controllers perform a test varies with the type of controller. Logic test controllers include a Pseudo Random Pattern Generator (PRPG) for generating test patterns in accordance with specified parameters. The test patterns are loaded or scanned into the testable modules associated with the test controller. The controller also includes a Multiple Input Serial Register (MISR), which analyzes the response of the testable modules to the test pattern generated by the PRPG. The MISR may produce a go/no-go output or output the response data for further analysis. Such controllers are well known in the art and are not described in further detail herein. Memory and other types of controllers similarly include means for testing modules associated with the controllers.

Embedded Test Controller Access Data File

Figure 4:
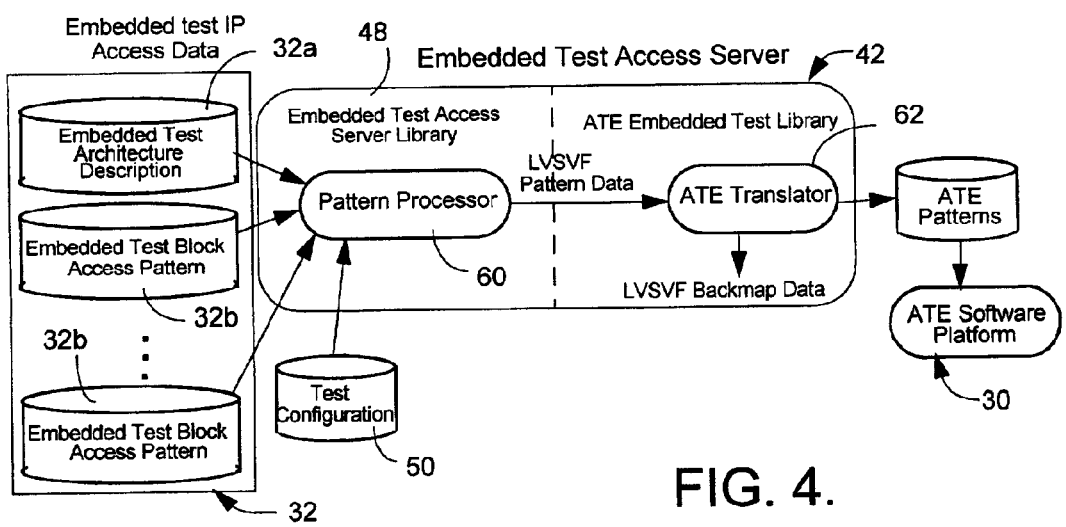
FIG. 4 is a block diagram illustrating a test pattern generation flow according to an embodiment of the present invention.

FIG. 4 diagrammatically illustrates the contents of an ETA file or database 32. The ETA file or database encapsulates the embedded test capabilities of a device under test and comprises the following sections:

1. An embedded test architecture description section 32a which describes the access and control interfaces of each embedded test block in the device. This includes the functionality of each embedded test block port and a description of each of the registers within the embedded setup scan chain of each test block. For example, this section would indicate the bit range within the setup scan chain of a logic test block used to specify the number of random patterns to be applied during a test. This section also describes the connections between the control and access ports of each embedded test block and the pins of the device or of an 1149.1 TAP. This section would indicate the TAP instruction register bit connection for the enable pin of the embedded test block;

2. An access pattern description section 32b which defines the patterns required to access, run, and retrieve information from each embedded test block; and 3 An optional result data section (not shown) for use with some forms of test blocks which produce test results that are derived through simulation and which cannot be efficiently generated in a run-time environment. These results must therefore be made available to the ETA software. An example of such result data would be signatures resulting from scan based logic embedded test controllers and vector data for use in diagnosing test failures down to a failing module.

The above data may be stored in any suitable or desired manner, including one or more files.

The ETA file can be developed in any desired manner. However, in accordance with the present invention, the file is developed as part of the design process of an integrated circuit device. FIG. 1 illustrates the overall flow for the architecture of the software system 10, according to a preferred embodiment of the present invention. The left side of the figure takes place within the design environment. The right side of the figure resides within a manufacturing test environment. The system consists of three main components: an embedded test IP (Intellectual Property) generator 12, an embedded test IP integrator 14 and the embedded test access software hereinafter referred to as ETA software 16. Embedded test IP generators are automation tools which create the integrated circuit design descriptions of the various embedded test blocks based on the requirements of the design component to be tested. These descriptions are stored in an embedded test IP design data file 18.

Embedded test IP integrators are automation tools which merge the embedded test IP design data file 18 with a chip design data file 20 to produce a chip with embedded test design data file 22. Generally, these data files are in the form of ASCII text files with component descriptions specified in Hardware Description Language (HDL) format. Such tools and files are generally well known to those skilled in the art. Among other functions, the embedded test IP Integrator tool inserts into file 22 a specification of the connections between the control and access ports of the embedded test blocks to the pins of the device under test or to an IEEE 1149.1 Test Access Port (TAP) implemented in the device. The chip with embedded test design data file 22 is used by manufacturing hardware/software 24 to manufacture an integrated circuit or chip 26. Embedded test IP generator and integrator tools have been available commercially for some time and, accordingly, are not described in detail herein.

In accordance with the present invention, these tools are adapted to provide detailed information required in the three sections of embedded test access data file 32 to allow the access software 16 to autonomously perform embedded test execution, embedded test result extraction and diagnosis. Conveniently, these tools are also adapted to concurrently generate a "default" test configuration file for use in testing all test controllers in the device under test and specifying default runtime parameters for each test controller. This default test configuration file can be edited by a user in a manner explained later.

Test Configuration File

FIG. 2 illustrates a test configuration file 50 and illustrates the syntax which may be used to specify test steps, test groups and runtime parameters for embedded test controllers.

A test configuration is an ordered collection of one or more test steps and a non-ordered collection of one or more test groups. A test step is the full execution, in parallel, of one or more embedded test controllers. Full execution includes the setup, running and collection of test results from test controllers. As can be seen in FIG. 2, the configuration of test step called TestStep1 begin at line 4 and ends at line 34. The test configuration specifies, in each test step, all runtime control options for all embedded test controllers that are necessary to generate test vectors for the test. Lines 19–32 specifies a memory controller and all of the runtime parameters associated with it. The test configuration specifies separate vectors and timing for each test step. In FIG. 2, these are specified at lines 5–18. As indicated at line 33, other test controllers of the same type, memory test controllers in this case, may be added to the test step at that point.

A test Group is an ordered collection of test steps. Test groups allow a test program to select groups of test steps for execution at specific points which may be interleaved with non-ATE vectors. This selection capability allows the test program to be optimized for early detection of most failures, thereby reducing test time. An external ATE may be required to program different timing (i.e. periods, events per pin, etc.) for every test step delineated in the test configuration.

Thus, with reference to FIG. 2, a test group called Group1 is defined between lines 3 and 45 and includes aforementioned TestStep1. As indicated at line 44, additional test steps in the group may be inserted at that point. Line 46 indicates that additional test groups may be defined at that point.

The test configuration is stored in an ASCII text file which may created or modified using a standard text editor. However, the present invention provides a user interface program for both accessing the ETA file and displaying icons which represent embedded test controllers and associated runtime options in such a manner as to allow a user to easily create a test configuration, specify test controller runtime parameters and diagnosis preferences. The user interface is described later.

It will be understood that the structure of test configuration may be modified without departing from the spirit of the invention.

Test Program

Figure 3:
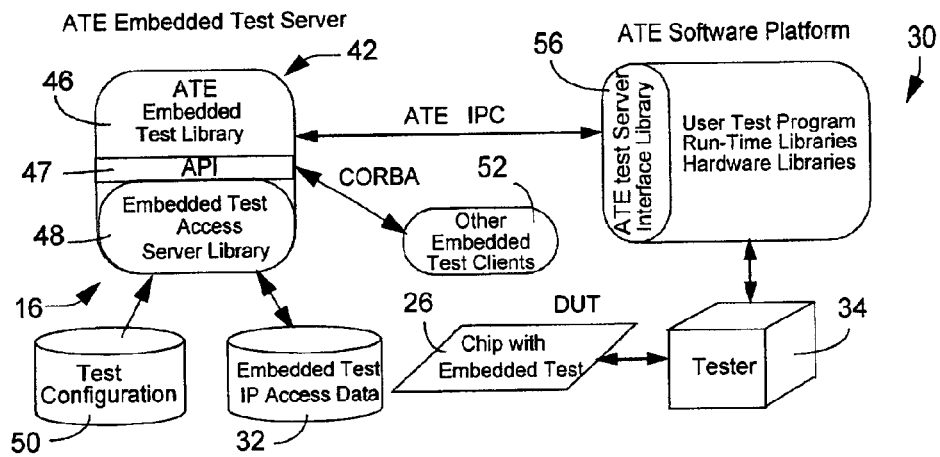
FIG. 3 is a block diagram which diagrammatically illustrates a library-level architecture of an embedded test controller access system according to an embodiment of the present invention.

Reference will now be made to FIG. 3. Heretofore, in an integrated circuit production environment, a user would develop and load a test program onto the ATE tester controller software platform 30 using an Operator Interface Box or a workstation (not shown). The ATE software platform includes the vendor specific software in the form of runtime libraries and hardware libraries which read and execute instructions contained in the test program on the ATE tester hardware 34. The user defined test program is the combination of code and data which actually drives the ATE tester to test devices. The test program source code typically has different forms for different ATE tester platforms (i.e. C code in Toolbox™, block oriented ASCII code in Agile™, etc.)

Although the present invention seeks to eliminate the need for conventional test programs, it provides means to allow conventional test programs to access the system of the present invention. Since ATE tester software is highly specialized to each ATE tester model and, due to legacy considerations, they are generally inflexible to language or communication modifications. For this reason, the bulk of the embedded test access functionality of the present invention resides in ETA server software described below. Client programs, such as user defined test programs, graphical and shell user interfaces, require only a small library of utilities to communicate with the ETA server. Thus, the present invention provides a small library of programs labeled, "ATE Server Interface Library" and generally designated by reference numeral 56 which is installed on the ATE tester controller and can be called from within a client program when necessary to access ETA software functions and the ETA data. Similarly, the ETA system can call to the library to perform operations on the ATE tester. Appropriate interprocess communication methodology, such as RPC or CORBA, can be used on the tester software platform to access the ETA software.

Thus, a user may develop a conventional test program and incorporate into it high-level instructions provided by interface library 56 to communicate with the ETA system. The high-level instruction set provides a means by which a test developer can create a test program without the need for detailed knowledge of the embedded test software architecture. More specifically, the instruction set provides the following functionality:

Specifies to the ETA system the device being tested by specifying the name and location of device files;

Loads a set of patterns complete with logic, format and timing generated by the ETA server into the memory of tester 34;

Extracts failure data from a pattern run and sends it to the ETA server environment for diagnosis; and Receives the failure information from the ETA server and inserts it into the tester system data collection stream.

The ETA Software System

The ETA software is linked between the environment in which the device under test is located, in this case, the ATE software environment, and the embedded test blocks in the device under test. Integration of the ETA software with the that environment allows a test program developer to perform a number of specific operations including observing the behavior of the embedded test blocks (i.e., play different "what-if" scenarios) by specifying different modes and parameters of the embedded test blocks, which allows for designing optimal "production" test programs, developing test programs that, at initialization, creates a set of patterns, loads them into pattern memory in the ATE tester and runs on a go/no go basis in the test production floor, diagnosing a failing embedded test block such that, for example, the user can diagnose logic embedded test failures down to the failing flip-flops and memory embedded test failures down to the failing memory cell; and providing a set of diagnostic procedures that can be called from the test program to aid in statistical data analysis of the device under test.

The ETA software 16 of the present invention is adapted to run directly on an ATE test system 30 and gives a client program full access to all test blocks embedded within the device 26 under test. However, as already mentioned, the ETA software may be located remotely and connected to the device by any suitable means. The ETA software is also capable of performing tests and diagnosing test results without the need of a conventional test program, as will be explained.

FIG. 3 illustrates a library-level architecture of the ETA system in an environment that is directly accessible to an ATE tester. The system includes an ATE embedded test server 42 and the ATE software program platform 30 which controls an ATE tester hardware 34.

Server 42 includes an ATE library 46, an Application program Interface (API) 47 and an ETA library 48 which reads a test configuration data file 50 and ETA file 32. API 47 provides communication between libraries 46 and 48 as well as with other client programs 52. Library 46 communicates with the tester or with a test program running on the ATE software platform via interface library 56. The ETA software includes a user interface 54, described later. The server software 42 may be installed on the same machine on which the ATE software 44 is loaded or may be loaded on a separate machine and connected to the ATE software machine by means of a suitable network.

ATE library 46 targets ETA library 48 to a specific tester model by providing a communication link to a test program or to the utilities in library 56, translating patterns from a tester independent format into a tester specific format; loading translated patterns into and executing patterns on the tester, and translating tester specific test results into a tester independent format and transmitting the translated test results to Library 48 for processing. To that end, library 46 may include a plurality of translation libraries, one for each of the various models of ATE testers. When initializing the system, the user merely specifies the specific ATE tester model to use which will cause library 46 to access the associated translation library for that model.

Server library 48 provides the primary functionality of the ETA software 16, that being the processing of the ETA and test configuration files, performing user defined tests of the device under test and diagnosing test results. To that end, library 48 is comprised of a pattern processor 60 and a datalog generator 66. The pattern processor is described first.

Pattern processor 60 is responsible for generating test patterns required to perform a test specified in a test configuration file. FIG. 4 illustrates a test pattern generation process incorporated into the pattern processor of the present invention. Pattern Processor 60 is operable to read the ETA file and the test configuration file. It includes a library (not shown) of test configuration specifications and specific procedures for processing each specification. This allows the processor to read each specification in the test configuration file and, using the ETA file, generate a corresponding instruction or sequence of instructions in a generic or ATE tester independent format. For each test step specified in the test configuration file, pattern processor 60 performs the following tasks:

1. Identifies the embedded test blocks specified in the test step and, for each test block, extracts from the access pattern description section of the ETA file, the access patterns required to run the test controller in the mode specified by the test step;

2. Merges the extracted patterns for each of the test controllers in the test step into a single pattern set so that all embedded test blocks in the test step are executed in parallel;

3. Using the embedded test architecture description section of the ETA file, associates the test pattern set with the I/O pins of the device under test or to the Test Access Port interface of the device to produce a sequence of all of the instructions necessary to effect the test step specification;

4. Translates the targeted test pattern set to a tester independent format, such as Serial Vector Format (SVF), and stores the translated test patterns as a tester independent format test pattern file. SVF is a known high level language for IEEE 1149.1 (see *Serial Vector Format Specification*, Copyright 1994 Texas Instruments, Copyright 1997Asset Intertech, available from Asset intertech, part number: ASSET-SVF-DOC, Revision D, Jul. 28, 1997, which is incorporated herein by reference). While SVF is preferred, any other generic format may be employed without departing from the spirit of the invention.

ATE Library 46 includes an ATE pattern translator 62 which translates each instruction in the tester independent test pattern file produced by pattern processor 50 and performs the following additional tasks:

5. Expands the high-level SVF commands in the tester independent format test pattern file to chip I/O transitions and then translates the transitions into the specific format required by the target tester;

6. Transmits the translated patterns to the ATE server interface utility 56 which applies the commands to the tester; and 7. Produces and stores SVF backmap data to a backmap file or database for use during failure datalogging process described later.

The tester independent formatted pattern set and the corresponding tester specific translation are essentially the equivalent of the conventional test program.

This pattern generation flow is well suited for a real-time test environment because the embedded test patterns are relatively simple. A typical embedded test controller execution generally involves an initialization of a few dozen register bits in the embedded test blocks, a repeat loop of a few million at-speed ATE clock cycles, and a result capture of a few dozen register bits in the embedded test blocks.

Failure Datalogging

Datalogging in an ATE environment refers to the process of gathering and reporting information about failures in a device under test. This data describes the symptoms of the problems in the device under test, i.e. how the device fails. The dataloged failure information may either be used in real time or collected in a log file for off-line analysis. Diagnosis refers to the process of analysis of a failing device and determining why a device fails. The distinction herein between datalog and diagnosis is made by defining datalog as any failure information obtained without changing any vectors.

Figure 5:
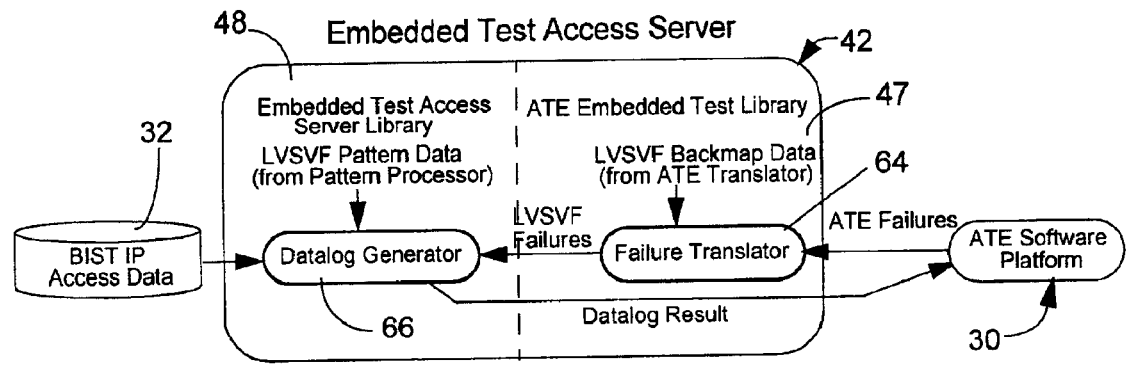
FIG. 5 is a block diagram illustrating a failure datalog flow according to an embodiment of the present invention.

FIG. 5 illustrates a failure datalog flow process according to the present invention. The ETA server library 48 further includes a failure datalogging mechanism which allows the system to interpret ATE failures reported by the ATE environment in the context of chip design data to provide meaningful datalog results. The mechanism includes a failure translator 64 in the ATE library 46, which receives ATE failure data from the ATE software program. The translator translates the failures to SVF failures, i.e. generic failure data, and forwards the translated failure data to datalog generator 66 in library 48. Datalog generator 66 accesses the ETA file and receives the SVF pattern data from the pattern processor 60 and SVF failure data from failure translator 64.

The datalogging process is comprised of the following steps:

1. ATE Failures, which represent "miscompares" in the test pattern execution, are sent to failure translator 64 in library 46 via interface 56 in the form of a pin name and an ATE cycle offset from the beginning of the ATE test pattern which resulted in the failure.

2. The failure translator looks up the ATE cycle in the SVF Backmap data to determine the SVF command that generated the "compare" pattern for that ATE cycle and specifies a corresponding SVF failure.

3. The failure translator sends the SVF failure to datalog generator 66 in the form of a failing SVF command and a failing bit offset within the command.

4. The datalog generator finds the original commands in the SVF and determines the failing bit offset from embedded test register data that is annotated to each SVF command.

5. The datalog generator compares the failing register bit against the access data in the ETA file for the embedded test controller to determine the semantics of the failure and generates a meaningful datalog in the context of the chip design. For example, a memory embedded test datalog might include the failing memory instance, address and data bits. A logic embedded test datalog might include the failing scan trial, or failing flip-flop instance(s).

The system is capable of providing automatic diagnosis of failures. A diagnosis request may be issued by any client, i.e. a GUI program or a user developed test program loaded into the ATE software. The request may be made by the user clicking a "Diagnose" option in a display of an user interface program to obtain bit-level failures or by instructions programmed into a user defined test program to instruct the ETA server to diagnose every failing memory element for all failing memory embedded test blocks. To automatically diagnose a failing memory or logic, the system may perform several iterations of the following sequence:

1. Create or modify a test step, which contains the embedded test block to be used for diagnosis;

2. Generate ATE patterns in the manner explained earlier;

3. Instruct the tester to load the patterns, execute them and return the result; and 4. Analyze the test result to determine whether additional information can be gathered by running the embedded test block in a different mode, or, if not, report the final result.

While a wide range of different algorithms may be used to diagnose logic tested by a logic test controller, all algorithms will consist of one or more runs of the test controller with different settings. The most time consuming portion of the diagnosis is to locate the failing trials. To locate failing trials, the test controller may be run a number of times where a run of the test controller consists of the following steps:

1. Initialize the PRPG (PS) and MISR for the start trial (MS);
2. clocking the test controller and associated testable modules for a number of ATE clock cycles (R); and
3. scanning out the expected MISR compare value (MC).

A run of the test controller may be implemented as a template of vectors. When this is done, the same set of vectors may be used repeatedly by simply "passing" in different values for different parameters, i.e. different values for PS, MS, R and MC. This enables reuse of the same pattern no matter what algorithm, i.e., binary, sequential, exponential sequential or other algorithm, is used to search for failures in the result data. Such algorithms are well known in the art and, accordingly, are not described herein.

A user may request the first failing trial, the first N failing trials, or all failing trials. Potentially, different algorithms may be used for each request. It has been found that a binary search algorithm is most suitable for a "First Failing Trial" request. Depending on the size of N, both a binary or a sequential search algorithms or a hybrid of them is suitable for a "First N Failing Trials" request. A sequential search algorithm is believed to be most suitable for an "All Failing Trials" request in most cases. In some cases, the latter might not be feasible due to time required to generate all of the vectors or the size of the Vector Memory on the tester.

In the best mode of carrying out the invention, server library 46 is implemented as a C++ abstract base class and the ATE embedded test interface library 56 is implemented as a tester-specific subclass that serves as a translation layer between the generic server library 46 and a target ATE tester. The C++ class definition of Library 46 is a dual-purpose API. As a base class, it is directly accessible by the ATE embedded test library 56. The ETA Server Library C++ class definition is also preferably implemented as a CORBA interface which makes it accessible to any CORBA compliant client, such as a graphical user interface or a test program. Keeping the bulk of the system functionality in the server allows the server to be implemented in a high level C++ framework without regard to the test program implementation.

As can be seen in FIG. 3, API 47 is supported by the ETA server to respond to requests from any client such as a graphical user interface (GUI), a shell user interface (SUI) or a test program. In response to an appropriate request from any client, API 47 selects the ETA file for the device under test, creates, loads or saves a test configuration file, modifies a test configuration file; and diagnoses a specified failing circuit block.

User Interface

Figure 7:
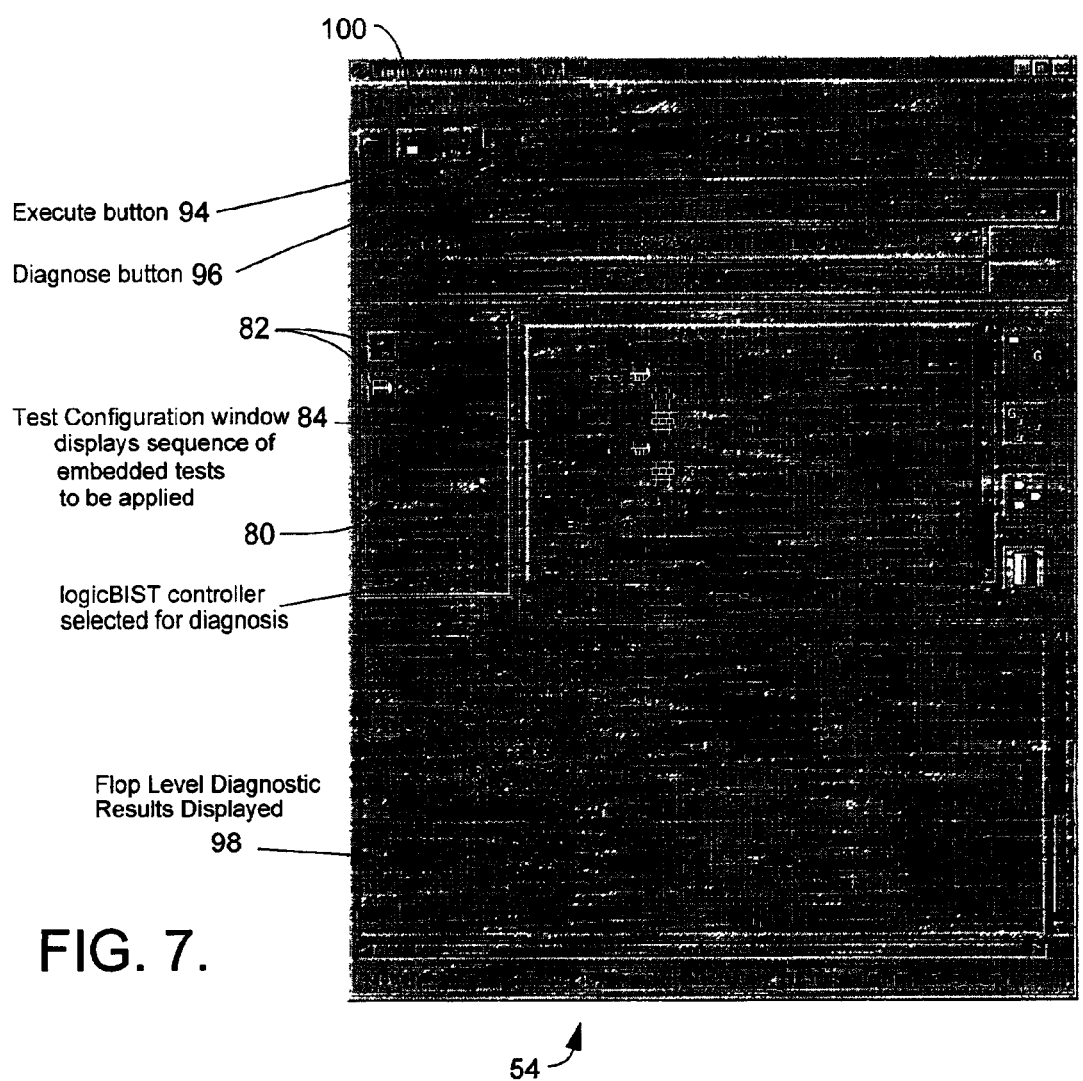
FIG. 7 is a view of a main window of a graphical user interface according to an embodiment of the present invention.

Conveniently, the present invention provides a user interface to facilitate the development of a test configuration file by providing the user with direct access to the functionality of the ETA server. More specifically, the user interface is designed to read both, the ETA file and the test configuration file and display information from both files on a computer display device. FIG. 7 shows a main window a graphical user interface 54. The window includes a box 80 which graphically illustrates an icon 82 representing each of the test controllers in the device under test. The example in the figure includes a logic test controller and a memory test controller. The test controllers can be selected and dragged into the test configuration box 84 in the center portion of the window. The test configuration illustrates a test group called "group_memory", which includes test steps and specific modules to be tested. To the right of the test configuration box are buttons 86, 88, and 90 for use in adding a test group, a test step and a test controller, respectively. The window provides means 92 for displaying and specifying the location of device files, including output files and log files. An "Execute" button 94 is provided to initiate and execute a test and a "Diagnose" button 96 for diagnosing test results. Diagnostic results are displayed in a box 98. A "Save" button 100 is provided to save a test configuration to a file. When the user selects a save option, the program writes, in ASCII format, all of the test specifications to a user specified test configuration file 50 in the sequence illustrated in the test configuration box and includes all of the runtime parameters specified in the parameter specification window for each specific test controller specified in the test configuration.

Figure 8:
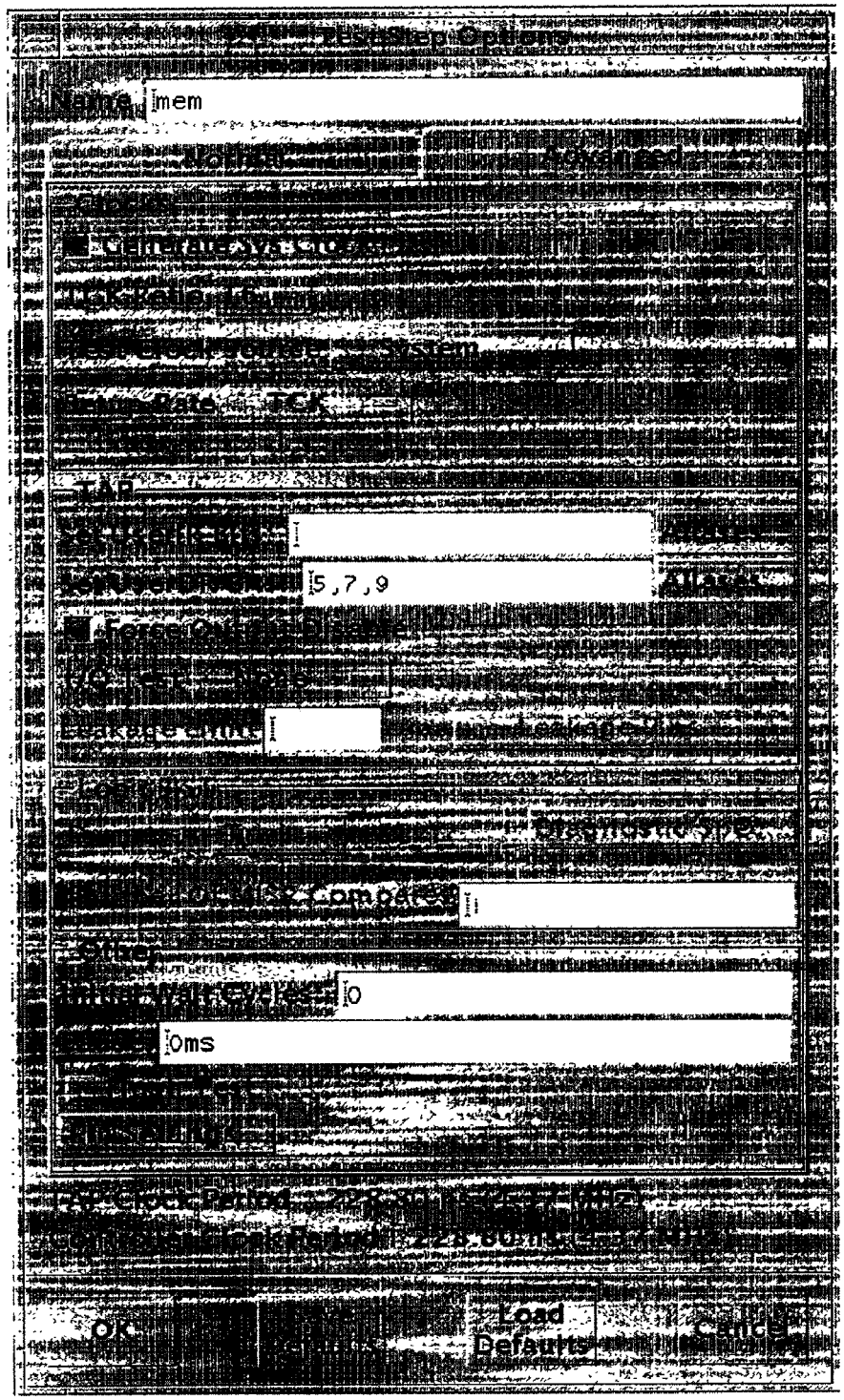
FIG. 8 is a view illustrating a window of a graphical user interface for use in specifying advanced runtime options for a memory test controller according to an embodiment of the present invention.

The user interface also provides means for displaying and editing all of the possible parameters associated with the test controller types handled by the system. FIG. 8 illustrates a test step window for specifying "Advanced" parameters associated with a selected logic test controller. A similar window would be provided for all other type types of test controllers, but with different parameters. Still further, the user interface may provide a button or other means for invoking any ATE program, if desired, to allow the interface to directly control the tester.

It will be understood that the content and layout of the user interface windows may be modified without departing from the spirit of the invention.

Figure 9:
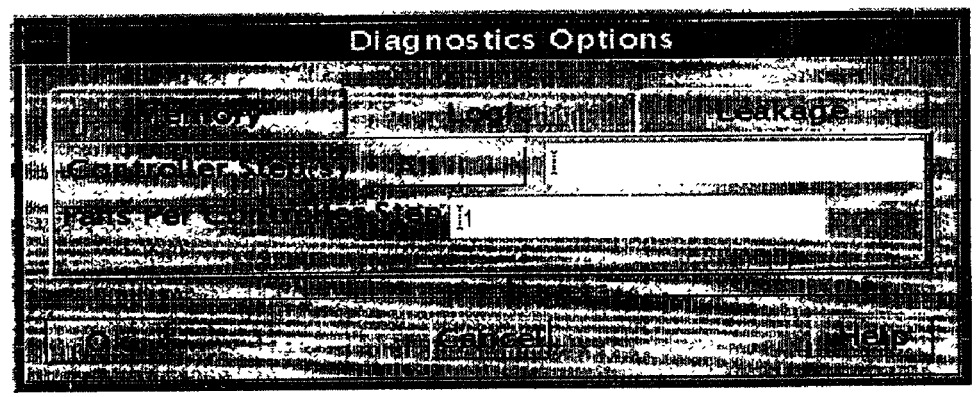
FIGS. 9 and 10 are views of windows of a graphical user interface for use in specifying diagnostic options for memory and logic test controllers, respectively, according to an embodiment of the present invention.
Figure 10:
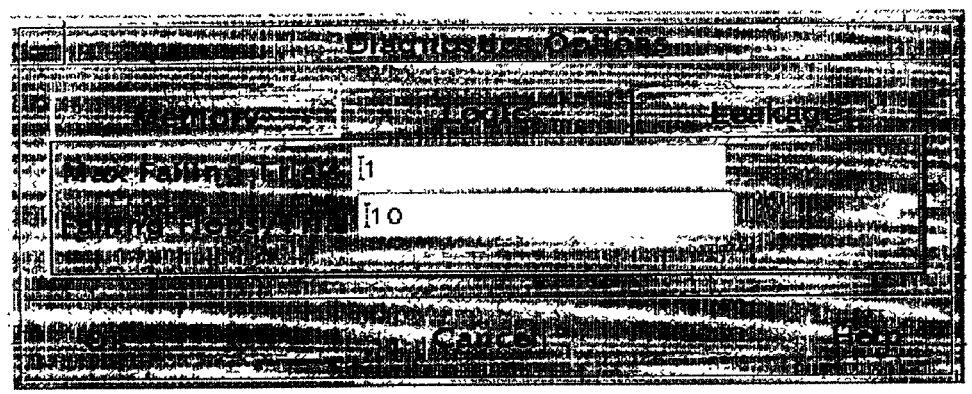

FIGS. 9 and 10 illustrate windows for use in specifying diagnostic options for a memory test controller and a logic test controller, respectively. Similar windows would be provided for all other types of test controllers handled by the system. It will be understood that the windows shown are for illustration purposes only and are not intended to be completely and comprehensively show all possible options and parameters associated with test controllers and test specifications.

Figure 11:
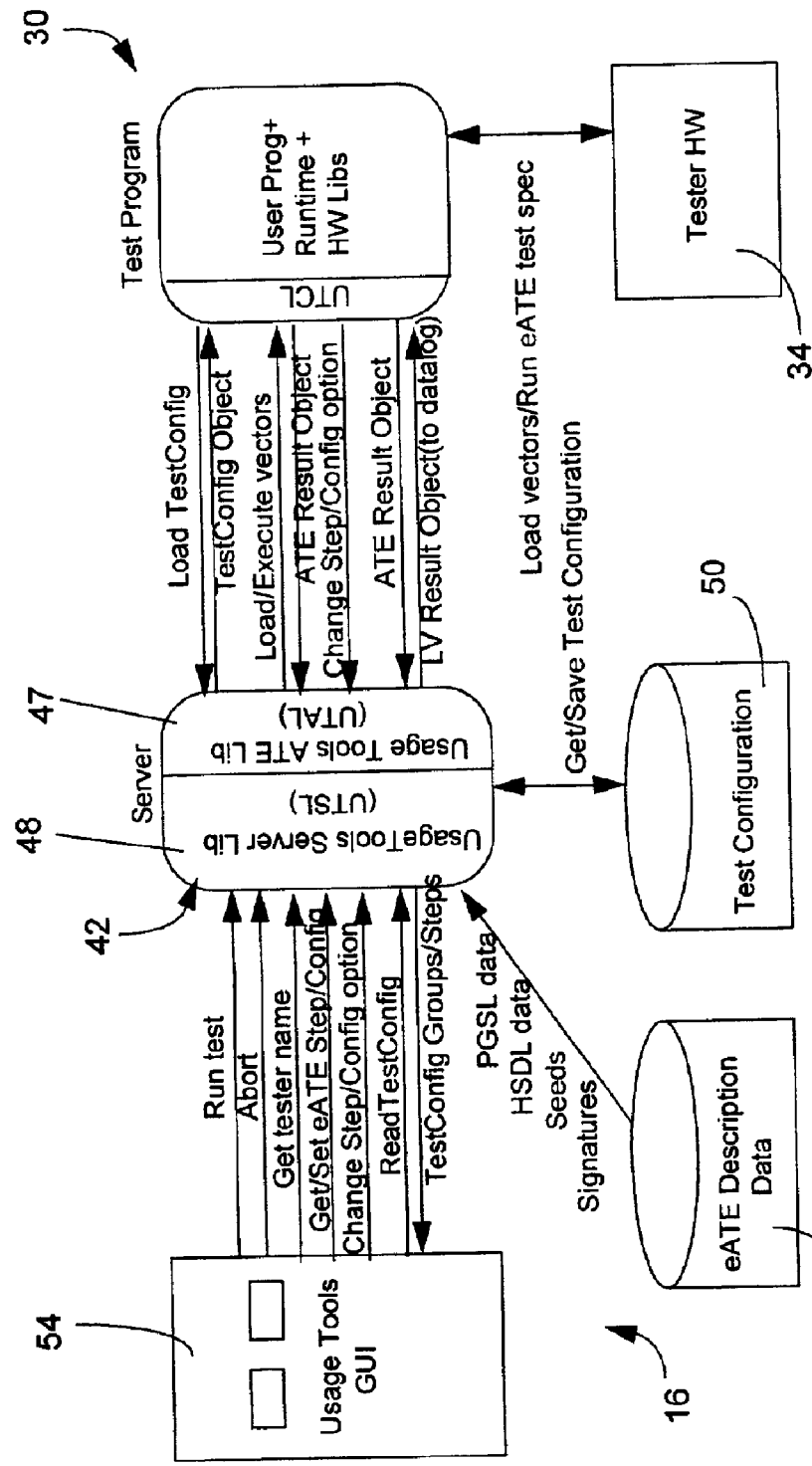
FIG. 11 is a higher level block diagram view of the embedded test access server and client software and ATE software environment according to an embodiment of the present invention and illustration the flow of data resulting from execution of a number of functions of the program product.

FIG. 11 illustrates the Interfaces and a number of functions between the various components of the system.

It will be understood by those skilled in the art that the present invention is not limited to the testing of individual devices. Indeed, the present applicants contemplate that the invention can be applied equally well to board and system tests. In such applications, the ETA server would store an ETA file associated with each chip on each board and/or system to be tested. The GUI would provide means for selecting and displaying all chips on a board or a selected board in a system, means for selecting a board, means for selecting a chip on the selected board, means for displaying and selecting test controllers on a selected chip, and means for creating, editing and executing test steps and test groups and for saving a test configuration file for a board or system in the manner explained earlier.

ATE Software Integration

Figure 6:
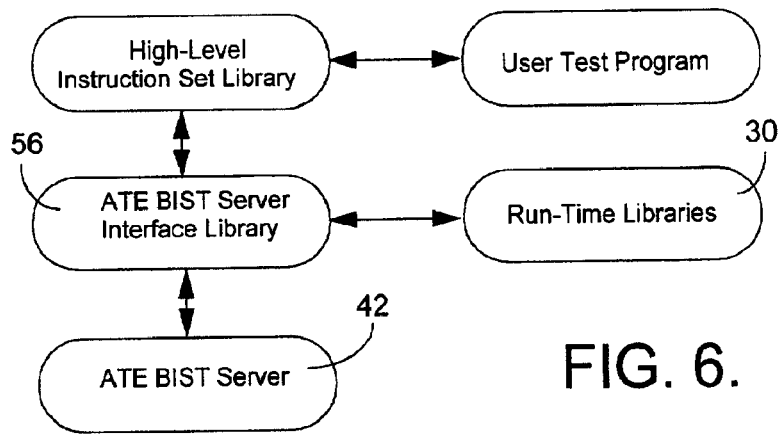
FIG. 6 is a block diagram illustrating an ATE software platform architecture according to an embodiment of the present invention.

FIG. 6 illustrates the manner in which the ETA software is integrated into the ATE software platform. The high-Level Instruction set library provides communication between a user test program and with the interface library 56. Interface Library 56 communicates with runtime libraries and also communicates with the ETA server in the manner explained earlier. A consideration in the development of the present invention was providing the embedded test access functionality to a user test program with minimal impact. The high-level instruction set provides easy to use test instructions that insulate the user test program from the embedded test server interface. The runtime libraries provide direct access to the embedded test server interface to provide automatic functions, such as failure reporting in datalog mode.

A test program developer uses the combination of the graphical User Interface 54 and the ATE debugging environment to create test programs. Using the GUI, the test engineer finds the optimum set of patterns required to guarantee the functionality of the device under test. With the instruction set built into the ATE environment, the system writes code that does the following:

Connects to the Embedded Test ATE Library;
Requests the test configuration data for the device under test from the ETA server;
Receives test vectors from the ETA server;
Converts the test vectors into test patterns; and
Loads the test patterns into the pattern memory of the tester.

Diagnosis routines are provided that can be called automatically from a test program depending on failure criteria specified by the product support engineer. Test floor production personnel load the test program as they would any other program in the test manufacturing flow. Upon initialization, the test program automatically connects to the ETA server, identifies the device being tested, loads the associated pattern, and is ready for testing.

A product support engineer monitors the performance of the device. More detailed information about a production run can be obtained by enabling the diagnostic routines written by the test engineer. Failure analysis on individual parts can be obtained using the user interface GUI. Using these tools, test program performance can be further optimized for production.

A further aspect of the present invention relates to a system which allows a workstation to be connected directly to the device under test and to an associated method of testing the device. As shown in FIGS. 12 and 13, a high-speed device 110 is provided with the ETA software and is connected to connected to the JTAG pins of the device under test mounted on a standard loadboard through a 5-pin low speed cable 112. The device is powered and clocked by an ATE tester 34, in a conventional fashion. The device 110 is connected with a communication port 114, such as a bidirectional input/output parallel or serial port, of an ATE workstation 116. The software in device 110 includes an appropriate port driver, such as a parallel port driver 118 which communicates with ATE library 46 and port 114.

The Figure diagrammatically illustrates the test program executing software which forms a standard part of ATEs. The ETA software of the present invention is connected to the test program executing software by means a software link. The link is written in custom code which can be included into any test program in all ATE environments and it is called "user function". User functions are conventionally provided in ATE systems to complete the capability of a given ATE software platform if any need arises which the ATE software environment does not directly support.

These User functions which are written by the test engineer in the native ATE software language, usually C, and are linked into the test program executable. A User function may be used to open a communication channel (RPC) to the ETA server on the workstation. This channel may be used to make calls to and receive results only from a test program. Then, another communication channel is opened and its address is sent to the ETA server through the first channel. In this way, the ETA server will have the handle to call the test program if it needs anything to be done.

Pseudo code for the user function which would establish the communication between test program and ETA server may be as follows:

```
int
EstablishConnectionWithETAServer
{
Create an RPC Client handle to the ETA Server;
Create another Socket.
Call the ETA Server and pass the socket address to it;
Two way calling communication channel has been established.
}
```

The ETA software can take over and access/diagnose the device through the port.

Once the communication between the test program process and ETA server has been established, they both can make requests to each other. Other User functions may also be written to respond to and execute different user test steps based on requests made by the ETA server. These user functions can be compiled into a library or supplied as source code for each ATE platform.

No enhancements or modifications to the previously described ETA user interface are required to operate in the embodiment shown in FIGS. 12 and 13.

This embodiment provides a number of advantages. The embodiment can be easily installed on older fully amortized ATE allowing the present invention to be employed on existing equipment without the need of upgrading the unit. It can also be installed on a user's tester of choice including low cost and mixed signal ATEs.

It will be seen from the foregoing that the present invention provides a computer program product and system that supports a complete embedded test related test flow. The system supports the automatic creation and integration of embedded test blocks within the design environment as well as the automatic access and control of the embedded test within the manufacturing test environment. This provides a seamless transfer of embedded test related information from the design environment to the manufacturing test environment, allowing for automated control of the embedded test for production go/no-go testing, production datalogging, as well as advanced failure diagnosis. The system removes the need for all of the batch oriented test pattern generation needed heretofore for manufacturing test and reduces, if not eliminates, the reliance by test engineer on the design community.

While the preferred embodiment of the present invention is a system which is designed to operate with any ATE tester platform, it is to be understood that the invention is not to be construed as being limited to that embodiment. Indeed, there is considerable benefit in providing a system which generates the embedded test IP Access Data file which can be accessed during both design and manufacturing test environments. Thus, it is within the scope of the present invention to provide an embodiment in which the various functions are designed for a specific ATE tester system, which means that some of the libraries described herein may not be required.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A system for use in testing a circuit having embedded test controllers therein in an ATE environment having a tester for connection to said circuit, said system comprising:
   means for generating a test program including:
      means for reading an embedded test controller access data file, a test controller diagnosis data file containing signatures and vector data for use in diagnosing test failures down to a failing module, and a test configuration data file defining one or more test steps respecting one or more test controllers embedded in said circuit;
      means for generating test pattern data derived from said access data file for each of said one or more test steps and said one or more embedded test controllers specified in said test configuration data file;
      means for generating an ATE independent sequence of instructions for loading said test stimulus data into a device under test, performing a capture operation and extracting response data from said device;
   means for translating said ATE tester independent sequence of instructions into a tester specific sequence of instructions;
   means for loading said tester specific sequence of instructions into said tester for execution.

2. A system as defined in claim 1, said test program being a user defined program which is linked with kernel libraries of an ATE tester, directly controls ATE tester hardware and is a combination of software code and data which drives said ATE tester to test devices under test, said means for generating a test program including:
   means for reading an embedded test controller access data file, displaying and selecting each of the embedded test controllers in a device under test;
   means for defining individual test steps;
   means for defining one or more test groups;
   means for arranging said test steps in a user selected sequential order;
   means for selectively executing one or more of said test steps;
   means for writing a test program to a test configuration file; and
   means for linking said test program with an ATE software.

3. A system as defined in claim 1, including means for enabling and disabling a dalalogging process for gathering and reporting information about device under test failures, describing the symptoms of the device failures and displaying failure information on a display means and/or storing said information in a "log" file for off-line analysis.

4. A system as defined in claim 1, including means for enabling a user to define a sequence of test steps in which, in each step, one or more test controllers embedded in said device are to be run and to define or change runtime parameters and datalog request for any of said controllers or test step and, when executed, the appropriate predetermined vectors for a selected test group are executed without any functional vectors.

5. A system as defined in claim 1, further including:
   means for enabling and disabling a dalalogging process of gathering and reporting information about device under test failures, describing the symptoms of the device under test, displaying failure information on a display medium and/or storing said information in a "log" file for off-line analysis; and
   means for enabling a user to define a sequence of steps in which, in each step, one or more test controllers embedded in said device are to be run and to define or change runtime parameters and datalog request for any of said controllers or test step and, when executed, appropriate predetermined vectors for a selected test group are executed without any functional vectors;
   means for diagnosing device failures.

6. A system as defined in claim 2, each said test step defining to the full execution of one or more test controllers in parallel, including setup, running and collection of controller test results of said one or more test controllers and runtime control options for all test controllers to generate vectors for the corresponding test step, and each test step having its own separate test vectors and timing specifications.

7. A system as defined in claim 2, each said test group being an ordered selection of test steps and allowing an ATE test program to select groups of Test Steps for execution at specific points during testing which may be interleaved with non-system specified vectors.

8. A system as defined in claim 1, said means for translating said test program including:
   means for storing translation data for each of a plurality automated test equipment tester models; and
   means for specifying the model of an automated test equipment tester to be used with said system, said means for translating using translation data associated with a specified tester model for translating said test program and said test stimulus.

9. A system as defined in claim 1, further including:
   means for generating and storing backmap data for each command in said test program for use in determining a command in said test program that generated a compare pattern which resulted in a test failure.

10. A system as defined in claim 1, further including:
    a failure translator for translating ATE failure data output by said ATE tester to tester independent failure translated failure data; and
    a datalog generator responsive to translated failure data from said failure translator for accessing said embedded test controller access data file and pattern data from said a pattern processor for determining the original commands in said test program and the failing bit offsets in a embedded test register data annotated to each command, comparing failing register bits against access data for an associated embedded test controller to determine semantics of the failure and generating a datalog in the context of the chip design.

11. A system as defined in claim 10, said datalog generator generating the failing memory instance, address and data bits for a memory embedded test datalog, and, generating a failing scan trial, or failing flip-flop instances for a logic embedded test datalog.

12. A system as defined in claim 1, further including a user interface means to enable a user to define a test configuration, said user interface means including:
    display means for displaying embedded test block identity of each embedded test block in said device under test and each operational mode of each said embedded test block;

means for specifying a test configuration including:
  means for selecting one or more of said embedded test blocks for testing;
  means for specifying an operating mode for each selected embedded test block;
  means for storing test configuration data in a test configuration data file;
means for initiating a test; and
means for initiating a diagnosis of test result data.

13. A system for use in testing a circuit in an ATE environment having a tester for connection to said circuit, said system comprising:
  means for generating a test program including:
    means for reading an embedded test controller access data file containing a embedded test architecture description for a device under test, embedded test access patterns for each embedded test block in said device, and optional result data for each embedded test block, said Embedded test controller data describing only embedded test capabilities and their connections to functional-mode structures in said device; and
    means for reading test configuration data file identifying one or more embedded test blocks on which a test is to be performed and an operating mode for each said one or more embedded test blocks; and
    means for generating a test stimulus for each of one or more embedded test blocks in said circuit;
  means for translating said test program and said test stimulus into a format required by an ATE tester to provide a translated test program and test stimulus, including:
    means for storing translation data for each of a plurality automated test equipment tester models;
    means for specifying the model of an automated test equipment tester to be used with said system, said means for translating using translation data associated with a specified tester model for translating said test program and said test stimulus; and
    means for generating and storing backmap data for each command in said test program for use in determining a command in said test program that generated a compare pattern which resulted in a test failure.
  failure translator means for translating ATE failure data output by said ATE tester to SVF failures and generating translated failure data; and
  datalog generator means responsive to translated failure data from said failure translator for accessing said Embedded test controller Access data file and pattern data from said means for generating a test program for determining the original commands in said test program and the failing bit offsets in a embedded test register data annotated to each command, comparing failing register bits against access data for a embedded test controller to determine the semantics of the failure and generating a Datalog in the context of the chip design.

14. A system as defined in claim 13, further including user input means for use by a user for specifying a test configuration and storing said test configuration in a test configuration data file, said user input means further including:
  means for communicating with an ATE tester associated with said system, including:
    means for instructing said tester to load a set of patterns complete with logic, format and timing received from said embedded test Server into tester memory;
    means for extracting failure data from a pattern run from said tester; and transmitting said failure data to said system for diagnosis; and
    means for receiving the failure diagnostic information from the embedded test server and insert failure diagnostic information into a data collection stream of said tester.

15. A program product for generating a computer readable embedded test controller access data file for use in a system for designing and testing circuits, said program product including:
  a computer readable storage medium;
  means recorded on said medium for reading a circuit design data file and an embedded test controller design data file;
  means recorded on said medium for determining the architecture of the embedded test structure in said files and generating a computer readable description of embedded test architecture; and
  means recorded on said medium for identifying all embedded test controllers in said embedded test controller design data file and generating a description of embedded test controller access patterns and operating modes for each said embedded test controller; and
  means recorded on said medium for writing said descriptions to said embedded test controller access data file and for storing said embedded test controller access data file on a computer readable medium.

16. A system for use in the design and testing of electronic circuits in an automated test equipment environment including a tester for connection to an electronic circuit and for applying thereto test patterns for testing embedded test blocks in said electronic circuit, said system comprising:
  means for reading a embedded test block access data file of said electronic circuit;
  means responsive to user input for selecting one or more embedded test blocks in said circuit under test, specifying a mode of operation of each of one or more selected embedded test blocks;
  means responsive to said user responsive means for generating a test program and a test stimulus for use therewith for each selected embedded test block in a format recognized by said tester and providing said test pattern to said user responsive means; and
  means responsive to said user responsive means for instructing said tester to load said test patterns into said electronic circuit, execute said patterns and return a test result so as to effect a test of said selected embedded test blocks in said circuit.

17. A system as defined in claim 16, further including means for analyzing said test result to determine whether additional information can be obtained by running said embedded test blocks in a different mode.

18. A system as defined in claim 17, said analyzing means including means for re-iteratively creating or modifying a test step which contains a embedded test block to be used for diagnosis, generating tester patterns, instructing the tester to load the patterns, execute the test patterns and return a result until no additional information can be obtained by performing further test steps.

19. A system as defined in claim 17, said means for analyzing being operable to produce a final test report when no additional information can be obtained by running said embedded test blocks in different modes.

20. A system as defined in claim 16, said data file having a embedded test architecture description for device under test, embedded test access patterns for each embedded test block, and, optionally, result data for each embedded test block.

21. A system for use in testing integrated circuits having embedded test controllers, comprising, in combination:
 a ATE tester for connection to a digital circuit device under test and having:
  means for supplying power to said device under test;
  means for supplying a test clock signal to said device under test;
  means responsive to a user developed test program for performing tests on said device including loading test patterns into said device and unloading device response data; and
 a user interface means for reading a test controller access data file and creating a test program configuration file; and
 a digital special- or general purpose computer comprising:
  a embedded test access device responsive to said user interface means for generating a test programs, said access device including means for reading an embedded test access data file describing in computer readable form the embedded test controllers in said device and transmitting said test programs to said means for performing tests.

22. A system for use in testing digital circuits having embedded test controllers, comprising, in combination:
 an ATE tester workstation having a tester head for supplying power to said device under test and a clock signal to said device under test;
 a digital special- or general-purpose computer comprising:
  a display device;
  a parallel input and output port;
  a user interface means in said workstation for use by a user in creating a test configuration data file;
  embedded test controller access means in said computer and responsive to said user interface means for generating a test program according to test program specifications delineated in said test configuration data file, said access means including means for reading said test configuration file and a embedded test access data file describing in computer readable form the embedded test controllers in said device and transmitting said test programs to said means for performing tests; and
 means responsive to said user developed test program for translating said test program into ATE specific test vectors and loading said test vectors into ATE vector memory and performing tests on said device in accordance with test program specifications delineated in said test configuration file.

23. An embedded test controller access program product for interfacing with an ATE software environment and for testing an electronic circuit with embedded test blocks therein, said program product comprising:
 a computer readable storage medium;
 means recorded on said medium for reading an embedded test controller data file stored on a computer readable medium and associated with said electronic circuit;
 means recorded on said medium for reading a test configuration file specifying one or more test steps to be performed on said circuit;
 means recorded on said medium for generating a sequence of instructions in a generic format for performing each of said one or more test steps;
 first translating means recorded on said medium for translating said sequence of instructions in a generic format to a sequence of instructions into a tester specific format;
 means recorded on said medium for loading said tester specific sequence of instructions into said tester for execution therein;
 second translating means recorded on said medium for translating response data output from said tester to response data in a generic format; and
 means recorded on said medium for analyzing said response data in generic format.

24. A program product as defined in claim 23, further including:
 means recorded on said medium for generating said embedded test controller data file including inserting into said embedded test controller data file:
  a description of an embedded test controller architecture for said circuit;
  a description of embedded test access pattern for each embedded test controller in said device, including chip pin data sequences required to initialize said embedded test controllers under all of their supported operational modes; chip pin data sequences required to have the controllers execute; chip pin data sequences required to extract test results from the controllers; and
  a description of expected test results including good signature values for each logic embedded test trial, good flop values for each logic embedded test trial; high and low boundary values for mixed signal component parameters; and, result data for any embedded test block which must be derived through simulation, and storing said access data file on a computer readable medium.

25. A program product as defined in claim 23, further including:
 user interface means recorded on said medium for generating a test configuration data file, said user interface means including:
  display means for displaying an icon representing each embedded test controller defined in said embedded test controller data file and in said circuit including:
   means for selecting each said icon and;
  means for defining one or more test steps including:
   means for selecting one or more of said embedded test controllers to be included in said test step and for specifying runtime parameters for each selected embedded test controller;
  means for storing test configuration data in a test configuration data file on a computer readable medium;
  means for executing said defined test steps; and
  means for initiating a diagnosis of test result data.

26. A program product as defined in claim 23, further including means recorded on said medium for diagnosing failures resulting from execution of said test including means for extracting expected test result data from said embedded test controller access data file and comparing said expected test result data with actual result to identify a failing module.

27. An ATE-independent method of testing an electronic circuit having one or more embedded test controllers and connected to an ATE tester, comprising:
 storing an embedded test controller access data file identifying test controllers embedded in said device, the test capabilities and the connections of each said test controllers to functional-mode structures in said device in a computer readable file;

generating a test configuration data file derived from said access data file and specifying one or more test steps to perform on one or more embedded test controller blocks in said circuit and the operating mode of each said one or more embedded test blocks, and storing said test configuration data file on a computer readable medium;

converting said test configuration file to an ATE-independent test program in computer readable form;

converting said ATE-independent test program to a tester specific test program; and loading said tester specific test program into said ATE tester and executing said program.

28. An ATE-independent method of testing an electronic circuit having one or more embedded test controllers therein and connected to ATE tester hardware, comprising:

reading a test controller access data file identifying all test controllers embedded in said device and describing the test capabilities and the connections of said test controllers to functional-mode structures in said device;

reading a test configuration file describing one or more test steps to be performed on one or more test controllers embedded in said device;

displaying a representation of each said test controllers and of each said test steps in a user selectable manner on a display device;

defining a test program including:
defining at least one test step, each test step including:
selecting on said display device one of more test controllers to be included in said test step;
specifying all runtime parameters associated with each selected test controller; and
writing a sequence of tester independent instructions for performing each said test steps;
converting each said instructions to a tester dependent format to provide said test program;

loading said test program into said tester;
running said test program on said tester;
analyzing test results returned by said test program; and
displaying said test results on said display device.

29. An ATE-independent method of testing an electronic circuit having one or more embedded test controllers and connected to an ATE tester, comprising:

reading a test controller access data file identifying all test controllers embedded in said device and describing the test capabilities and the connections of said test controllers to functional-mode structures in said device;

reading a test configuration data file describing one or more test steps to be performed on one or more test controllers embedded in said device;

defining a test program including:
writing a sequence of tester independent instructions for performing each said test steps;
converting each said instructions to a tester dependent format to provide said test program;

converting each said instructions to a tester dependent format to provide said test program;

loading said test program into said tester;
running said test program on said tester;
analyzing test results returned by said test program; and
displaying said test on said display device.

30. A method for use in the design and testing of electronic circuits within an ATE environment, the method comprising:

generating a embedded test controller access data file describing embedded test capabilities and their connections to functional-mode structures in said device including:
a embedded test architecture description for a device under test;
a embedded test access pattern for each embedded test block in said device, including chip pin data sequences required to initialize the embedded test controllers under all of their supported operational modes; chip pin data sequences required to have the controllers execute; chip pin data sequences required to extract test results from the controllers; and expected test results which include good signature values for each logic embedded test trial, good flop values for each logic embedded test trial; high and low boundary values for mixed signal component parameters; and, result data for any embedded test block which must be derived through simulation, and storing said access data file on a computer readable medium;

generating a test configuration data file identifying one or more test steps to perform on one or more embedded test blocks in said circuit and the operating mode of each said one ore more embedded test blocks, and storing said test configuration data file on a computer readable medium; and for each test step in said test configuration data file:
identifying each embedded test block to be included in the test step;
for each embedded test block specified for said test step in said test configuration file, filtering from said access data file, the embedded test access pattern to run in a controller mode specified for said embedded test block by said test step;
merging said filtered access patterns into a single test pattern set such that all embedded test blocks specified in said test step are executed in parallel;
associating said test pattern set with device input and output pins or to a device test access port interface to generate a processed test pattern set;
translating said processed test pattern set into a tester independent format to produce an tester independent test pattern set;
generating and storing a tester independent backmap of said tester independent formatted processed test pattern including annotating embedded test register data to each tester independent command;
expanding high-level independent instructions in the tester independent formatted processed test pattern into device input and output transitions;
translating said transitions to a target tester format; and
performing a test of said circuit by shifting in the target tester formatted test patterns into said selected embedded test block, performing a capture operation to capture response data of said selected blocks to said test patterns, and shifting out said test response.

31. A method as defined in claim 30, further including analyzing test response data including:

for each ATE failure, representing a mis-compare between a test response data and expected test response data in said test controller resulting from execution of a pattern, determining the pin name and ATE cycle offset from the beginning of a test pattern, determining, from backmap data for the ATE cycle, a corresponding ATE independent command that generated a test pattern for the cycle which that resulted in an ATE failure;

using the identity of failing tester independent command and failing bit offset within that command, finding the original command in the backmap and looking up the failing bit offset in test register data annotated to each tester independent command;

analyzing failing register bits against the access data for the embedded test controller to generate a description of the failure and generating a datalog report in the context of the design of said circuit.

32. A method as defined in claim 30, further including automatically diagnosing every failing module in an embedded test block following a test step, including:

performing one or more runs of a logic test controller with different settings for each run and locating one or more failing trials comprising:

initializing a test controller pattern generator seed (S) and a test controller Multiple Input Shift Register start trial (MS);

clocking the logic test controller and associated modules for a number of ATE clock cycles (R); and scanning out the expected MISR Compare value (MC).

33. A method as defined in claim 32, further including patching test patterns in each run comprising for every iteration of a logic diagnosis algorithm, updating a previous test pattern in tester memory with a new scan pattern count and expected signature and using a binary search to locate failing scan sequences.

34. A method as defined in claim 32, wherein when a run of a logic test controller is implemented as a template of vectors, using the same set of vectors for each test run but using different values for different parameters to enable reuse of the pattern regardless of the algorithm used for searching test result data to identify a failing module.

35. A method as defined in claim 34, wherein said step comprising searching for one of a first failing trial, a first N failing trials or ALL failing trials, using the same or different search algorithms for each diagnosis request and wherein for a first failing trial:, using for this request will be a binary search algorithm, for the first N Failing Trials, using, depending on size of N, both a binary or a sequential or a hybrid of them would be suitable, and for all Failing Trials: using a sequential search algorithm.

36. A method as defined in claim 30, further including automatically diagnosing every failing memory for each failing memory embedded test block following a test step, including performing one or more iterations of:

creating a new test step or modifying a current test step containing the embedded test block to be used for diagnosis;

generating ATE tester test patterns;

loading the ATE test patterns into the ATE tester, executing the ATE test patterns and returning circuit response data; and analyzing the circuit response data to determine whether additional information could be gathered by running the embedded test block in a different mode or report the final result.

37. A method of diagnosing test response data from a test performed on an electronic circuit device mounted in an ATE tester hardware and having embedded test controllers therein, said method comprising for each ATE failure representing mis-compares in an embedded test pattern execution:

determining the pin name and ATE cycle offset of said pin from the beginning of an ATE formatted embedded test pattern;

determining from a backmap data file for the ATE cycle, the identity of an ATE-independently formatted command that generated the compare pattern for the cycle that resulted in the ATE failure;

using the identity of failing the ATE-independent command and failing bit offset within that command, determining the original command in the backmap data file and the failing bit offset in embedded test register data annotated in the backmap associated with the ATE-independent command;

analyzing failing register bit against said access data file for the embedded test controller associated with said pin to generate a description of the failure and a datalog report in the context of the design of said circuit.

38. A method as defined in claim 37, said access data file describing embedded test capabilities and their connections to functional-mode structures in said device and including:

an embedded test architecture description for a device under test;

an embedded test access pattern for each embedded test block in said device, including chip pin data sequences required to initialize the embedded test controllers under all of their supported operational modes; chip pin data sequences required to have the controllers execute; chip pin data sequences required to extract test results from the controllers; and expected test results which include good signature values for each logic embedded test trial, good flop values for each logic embedded test trial; high and low boundary values for mixed signal component parameters; and, result data for any embedded test block which must be derived through simulation.

39. A method as defined in claim 37, further including, following executing of each test step, automatically diagnosing every failing memory for each failing memory embedded test block, including:

performing one or more runs of a logic test controller with different settings for each run and locating one or more failing trials comprising:

initializing a test controller pattern generator seed (S) and a test controller MISR start trial (MS);

clocking the logic test controller and associated modules for a number of ATE clock cycles (R); and scanning out the expected MISR Compare value (MC).

40. A method as defined in claim 37, further including reiterating each test step including:

patching test patterns in each run comprising for every iteration of a logic diagnosis algorithm, updating a previous test pattern in ATE tester memory with a new scan pattern count, and expected signature and using a binary search to locate failing scan sequences in said test response data.

41. A method as defined in claim 37, wherein, when a run of a logic test controllers is implemented as a template of vectors using the same set of vectors for each run but using different values for different parameters to allow for reuse of the pattern regardless of the algorithm used for searching test result data to identify a failing module.

42. A method as defined in claim 37, wherein said analyzing step comprising searching for one of a first failing trial, a first N failing trials or ALL failing trials, using the same or a different search algorithms for each diagnosis request and, wherein for a first failing trial, using a binary search algorithm, for the first N Failing Trials, using, depending on size of N, either a binary or a sequential or a hybrid thereof and for all failing trials: using a sequential search algorithm.

43. A method as defined in claim 37, further including automatically diagnosing every failing memory for each failing memory embedded test block following a test step, including performing one or more iterations of:
   creating a new test step or modifying a current test step containing the embedded test block to be used for diagnosis;
   generating ATE tester test patterns;
   loading the ATE test patterns into the ATE tester, executing the ATE test patterns and returning circuit response data; and
   analyzing the circuit response data to determine whether additional information could be gathered by running the embedded test block in a different mode, or report the final result.

44. A system for testing an integrated circuit in an ATE environment including an ATE having a test program executing software for running a user defined test program and a test head for connection to an integrated circuit under test, said integrated circuit having an IEEE test access port and one or more embedded test controllers, said system comprising:
   a digital computer having a bidirectional input/output port and embedded test controller access data and enabling means for use in selectively accessing and enabling said embedded test controllers, said test controller enabling means having means for interfacing with a user;
   a load board for connection to an intergrated circuit under test; and
   means connecting said bidirectional input/output port to pins of said test access port in said integrated circuit.

45. A system for testing an integrated circuit in an ATE environment including an ATE tester having a test program executing software for executing a user defined test program and a test head for connection to an integrated circuit under test said integrated circuit having an IEEE test access port and one or more embedded test controllers, said system comprising:
   a digital computer having embedded test controller access means and a bidirectional input/output port, said embedded test controller access means having means for interfacing with a user for generating a user defined test program for execution by said test program software and an embedded test access file describing test controllers embedded in said integrated circuit under test;
   a load board for connection to said integrated circuit under test and mounting in said test head of said ATE;
   means connecting said bidirectional input/output port to the pins of said test access port in said integrated circuit under test; and
   an ATE user function program in said computer for linking directly to said test program software in said ATE.

46. A method of testing an integrated circuit having embedded test controllers, comprising:
   storing a description of the embedded test architecture of each embedded test controller in said circuit in a computer readable file on a digital computer;
   selecting test controllers to be enabled during testing using a user interface of a test program generating software stored on said computer to generate a user defined test program using said description of selected embedded test controllers;
   mounting the integrated circuit in a test head of an automated test equipment (ATE);
   connecting a bi-directional communication port of said computer to pins of a test access port in said integrated circuit; and
   executing said user defined test program using a user defined function to communicate said user defined test program to a test program executing process in said ATE.

47. A method of developing a test program for use in testing an electronic circuit having embedded test controllers therein, comprising:
   storing in one or more computer readable files data describing test capabilities and their connections to functional-mode structures in said device of each test controller in said device;
   reading said one or more access data files, and determining all embedded test controllers and modules;
   displaying said test controllers on a display medium;
   defining one or more test steps, in which each test step defines the full execution including setup, running and collection of result data of one or more embedded test controllers in parallel; and
   storing defined test steps in a computer readable test configuration file.

48. A method as defined in claim 47, further including using runtime control options for all embedded test controllers in a test step to generate vectors for a corresponding ATE Test Step.

49. A method as defined in claim 47, each test step having its own separate vectors and timing specifications.

50. A method of remotely testing and diagnosing electronic circuits having one or more embedded test controllers, comprising:
   storing an embedded test controller access data file at a central location, said data file identifying test controllers embedded in said device, and data sequences required to initialize each embedded test controller under all of their supported operational modes, for causing the controllers to execute; and for extracting test results from the controllers; expected test results, including include good signature for each logic embedded test trial;
   storing a test configuration data file at said central location and identifying one or more test steps for initializing, executing said test controllers in said device, and extracting test results from said test controllers;
   connecting to said device;
   executing a test program derived from said test configuration and said access data to cause said controllers to initialize, execute and return test results;
   returning test controller test results to said central location; and
   analyzing said test results.

51. A method of remotely testing and diagnosing an integrated circuit device having one or more embedded self-test controllers each operable to test a predetermined block of said device and return test results, said method comprising:
   connecting to said device from a remote location;
   from said remote location, causing one or more of said self-test controllers to execute and produce test result data;

extracting said test result data from each said one or more self-test controllers and transmitting said result data to said remote location; and analyzing said test results at said remote location.

52. A method as defined in claim 51, said connecting to said device including connecting to said device by means of an internet connection.

53. A method as defined in claim 51, said remotely connecting to said device including connecting by means of a local area network connection.

54. A method as defined in claim 51, said remotely connecting to said device including connecting by means of a telephone dial-up connection.

55. A method as defined in claim 51, said device being located on a circuit board having other electronic circuits having embedded self-test controllers, said method further including causing each of said self-test controllers in each of said devices to execute to produce test results and transmit result data to said remote location.

56. A method as defined in claim 51, said causing one or more of said self-test controllers to execute comprising reading test controller initialization, execution and extraction data for each said one or more test controllers from a database, and loading said data into each said one of more controllers.

57. A method as defined in claim 51, said analyzing said data including retrieving from said database expected test result data for each said test controllers and comparing said controller test data with said expected test data and generating a report of failing devices in said test controller structures.

58. A system for remotely testing and diagnosing an integrated circuit device having embedded test controllers, comprising:

means for storing test controller access and execution data at a location remote from said device;

means for connecting to said device from said remote location;

means for causing one or more of said test controllers to execute and transmit test results from each said one or more of said test controllers to said central location; and means at said remote location for analyzing said test results.

59. A system as defined in claim 58, said means for remotely connecting to said device including an Internet connection.

60. A system as defined in claim 58, said means for remotely connecting to said device including a local area network connection.

61. A system as defined in claim 58, said means for remotely connecting to said device including a telephone dial-up connection.

62. A method of testing an electronic circuit device having one or more embedded test controllers operable according to one or more controller test programs to perform a self test of at least a portion of said device, said method comprising:

storing in a computer readable form, a device test controller access data file describing all test controllers embedded in said device, the test capabilities of and the connections of said test controllers to functional-mode structures in said device;

generating a test configuration in a computer readable form, said configuration specifying one or more test steps to be performed on said device, each test step specifying one or more test controllers to be executed; and connecting to said device; and loading test patterns derived from said access data file and said test configuration into said test controllers so as to cause said one or more controllers to execute said controller test programs according to said one or more test tests and output test result data.

63. A method as defined in claim 62, further including generating a device independent test program comprised of a sequence of instructions for executing each said test steps; and said loading test patterns including translating said device independent test program into a device specific test program and executing each said device specific test program.

64. A program product for performing ATE-independent testing of electronic circuits having one or more embedded test controllers and connected to an ATE tester, comprising:

a computer readable storage medium;

means recorded on said medium for storing an embedded test controller access data file identifying test controllers embedded in said device, the test capabilities and the connections of each said test controllers to functional-mode structures in said device in a computer readable file;

means recorded on said medium for generating a test configuration data file derived from said access data file and specifying one or more test steps to perform on one or more embedded test controller blocks in said circuit and the operating mode of each said one or more embedded test blocks, and means recorded on said medium for storing said test configuration data file on a computer readable medium;

means recorded on said medium for converting said test configuration file to an ATE-independent test program in computer readable form;

means recorded on said medium for converting said ATE-independent test program to a tester specific test program; and means recorded on said medium for loading said tester specific test program into said ATE tester and executing said program.

65. A program product for performing ATE-independent testing of an electronic circuit having one or more embedded test controllers therein and connected to ATE tester hardware, comprising:

a computer readable storage medium;

means recorded on said medium for reading a test controller access data file identifying all test controllers embedded in said device and describing the test capabilities and the connections of said test controllers to functional-mode structures in said device;

means recorded on said medium for reading a test configuration file describing one or more test steps to be performed on one or more test controllers embedded in said device;

means recorded on said medium for displaying a representation of each said test controllers and of each said test steps in a user selectable manner on a display device;

means recorded on said medium for defining a test program including:

defining at least one test step, each test step including:
selecting on said display device one of more test controllers to be included in said test step;
specifying all runtime parameters associated with each selected test controller; and writing a sequence of tester independent instructions for performing each said test steps;
converting each said instructions to a tester dependent format to provide said test program;
means recorded on said medium for loading said test program into said tester;
means recorded on said medium for running said test program on said tester;
means recorded on said medium for analyzing test results returned by said test program; and
means recorded on said medium for displaying said test results on said display device.

66. A program product for ATE-independent testing of an electronic circuit having one or more embedded test controllers and connected to an ATE tester, comprising:
a computer readable storage medium;
means recorded on said medium for reading a test controller access data file identifying all test controllers embedded in said device and describing the test capabilities and the connections of said test controllers to functional-mode structures in said device;
means recorded on said medium for reading a test configuration data file describing one or more test steps to be performed on one or more test controllers embedded in said device;
means recorded on said medium for defining a test program including:
writing a sequence of tester independent instructions for performing each said test steps;
converting each said instructions to a tester dependent format to provide said test program;
means recorded on said medium for converting each said instructions to a tester dependent format to provide said test program;
means recorded on said medium for loading said test program into said tester;
means recorded on said medium for running said test program on said tester;
means recorded on said medium for analyzing test results returned by said test program; and
means recorded on said medium for displaying said test on said display device.

67. A program product for use in the design and testing of electronic circuits within an ATE environment, the program product comprising:
a computer readable storage medium;
means recorded on said medium for generating a embedded test controller access data file describing embedded test capabilities and their connections to functional-mode structures in said device including:
a embedded test architecture description for a device under test;
a embedded test access pattern for each embedded test block in said device, including chip pin data sequences required to initialize the embedded test controllers under all of their supported operational modes; chip pin data sequences required to have the controllers execute; chip pin data sequences required to extract test results from the controllers; and expected test results which include good signature values for each logic embedded test trial, good flop values for each logic embedded test trial; high and low boundary values for mixed signal component parameters; and, result data for any embedded test block which must be derived through simulation, and storing said access data file on a computer readable medium;
means recorded on said medium for generating a test configuration data file identifying one or more test steps to perform on one or more embedded test blocks in said circuit and the operating mode of each said one ore more embedded test blocks, and storing said test configuration data file on a computer readable medium; and
for each test step in said test configuration data file:
identifying each embedded test block to be included in the test step;
for each embedded test block specified for said test step in said test configuration file, filtering from said access data file, the embedded test access pattern to run in a controller mode specified for said embedded test block by said test step;
merging said filtered access patterns into a single test pattern set such that all embedded test blocks specified in said test step are executed in parallel;
associating said test pattern set with device input and output pins or to a device test access port interface to generate a processed test pattern set;
translating said processed test pattern set into a tester independent format to produce an tester independent test pattern set;
generating and storing a tester independent backmap of said tester independent formatted processed test pattern including annotating embedded test register data to each tester independent command;
expanding high-level independent instructions in the tester independent formatted processed test pattern into device input and output transitions;
translating said transitions to a target tester format; and
performing a test of said test circuit by shifting in the target tester formatted test patterns into said selected embedded test block, performing a capture operation to capture response data of said selected blocks to said test patterns, and shifting out said test response.

68. A program product as defined in claim 67, further including means recorded on said medium for analyzing test response data including:
for each ATE failure, representing a mis-compare between a test response data and expected test response data in said test controller resulting from execution of a pattern, determining the pin name and ATE cycle offset from the beginning of a test pattern,
determining, from backmap data for the ATE cycle, a corresponding ATE independent command that generated a test pattern for the cycle which that resulted in an ATE failure;
using the identity of failing tester independent command and failing bit offset within that command, finding the original command in the backmap and looking up the failing bit offset in test register data annotated to each tester independent command;
analyzing failing register bits against the access data for the embedded test controller to generate a description of the failure and generating a datalog report in the context of the design of said circuit.

69. A program product as defined in claim 67, further including automatically diagnosing every failing module for each failing embedded logic test block following a test step, including:
performing one or more runs of a logic test controller with different settings for each run and locating one or more failing trials comprising:

initializing a test controller pattern generator seed (S) and a test controller Multiple Input Shift Register start trial (MS);

clocking the logic test controller and associated modules for a number of ATE clock cycles (R); and scanning out the expected MISR Compare value (MC).

70. A program product as defined in claim 69, further including patching test patterns in each run comprising for every iteration of a logic diagnosis algorithm, updating a previous test pattern in tester memory with a new scan pattern count and expected signature and using a binary search to locate failing scan sequences.

71. A program product as defined in claim 69, wherein when a run of a logic test controller is implemented as a template of vectors, using the same set of vectors for each test run but using different values for different parameters to enable reuse of the pattern regardless of the algorithm used for searching test result data to identify a failing module.

72. A program product as defined in claim 71, wherein said step comprising searching for one of a first failing trial, a first N failing trials or ALL failing trials, using the same or different search algorithms for each diagnosis request and wherein for a first failing trial:, using for this request will be a binary search algorithm, for the first N Failing Trials, using, depending on size of N, both a binary or a sequential or a hybrid of them would be suitable, and for all Failing Trials: using a sequential search algorithm.

73. A program product as defined in claim 71, further including means recorded on said medium for automatically diagnosing every failing memory for each failing memory embedded test block following a test step, including performing one or more iterations of:

creating a new test step or modifying a current test step containing the embedded test block to be used for diagnosis;

generating ATE tester test patterns;

loading the ATE test patterns into the ATE tester, executing the ATE test patterns and returning circuit response data; and analyzing the circuit response data to determine whether additional information could be gathered by running the embedded test block in a different mode or report the final result.

74. A program product for diagnosing test response data from a test performed on an electronic circuit device mounted in an ATE tester hardware and having embedded test controllers therein, said program product comprising for each ATE failure representing mis-compares in an embedded test pattern execution:

a computer readable storage medium;

means recorded on said medium for means recorded on said medium for determining the pin name and ATE cycle offset of said pin from the beginning of an ATE formatted embedded test pattern;

means recorded on said medium for determining from a backmap data file for the ATE cycle, the identity of an ATE-independently formatted command that generated the compare pattern for the cycle that resulted in the ATE failure;

means recorded on said medium for using the identity of failing the ATE-independent command and failing bit offset within that command, determining the original command in the backmap data file and the failing bit offset in embedded test register data annotated in the backmap associated with the ATE-independent command;

means recorded on said medium for analyzing failing register bit against said access data file for the embedded test controller associated with said pin to generate a description of the failure and a datalog report in the context of the design of said circuit.

75. A program product as defined in claim 74, said access data file describing embedded test capabilities and their connections to functional-mode structures in said device and including:

an embedded test architecture description for a device under test;

an embedded test access pattern for each embedded test block in said device, including chip pin data sequences required to initialize the embedded test controllers under all of their supported operational modes; chip pin data sequences required to have the controllers execute; chip pin data sequences required to extract test results from the controllers; and expected test results which include good signature values for each logic embedded test trial, good flop values for each logic embedded test trial; high and low boundary values for mixed signal component parameters; and, result data for any embedded test block which must be derived through simulation.

76. A program product as defined in claim 74, further including means recorded on said medium for, following executing of each test step, automatically diagnosing every failing module in each failing embedded test block, including:

performing one or more runs of a logic test controller with different settings for each run and locating one or more failing trials comprising:

initializing a test controller pattern generator seed (S) and a test controller MISR start trial (MS);

clocking the logic test controller and associated modules for a number of ATE clock cycles (R); and scanning out the expected MISR Compare value (MC).

77. A program product as defined in claim 74, further including:

means recorded on said medium for reiterating each test step including:

means recorded on said medium for patching test patterns in each run comprising for every iteration of a logic diagnosis algorithm, updating a previous test pattern in ATE tester memory with a new scan pattern count, and expected signature and using a binary search to locate failing scan sequences in said test response data.

78. A program product as defined in claim 74, wherein, when a run of a logic test controllers is implemented as a template of vectors using the same set of vectors for each run but using different values for different parameters to allow for reuse of the pattern regardless of the algorithm used for searching test result data to identify a failing module.

79. A program product as defined in claim 74, wherein said analyzing step comprising searching for one of a first failing trial, a first N failing trials or ALL failing trials, using the same or a different search algorithms for each diagnosis request and, wherein for a first failing trial, using a binary search algorithm, for the first N Failing Trials, using, depending on size of N, either a binary or a sequential or a hybrid thereof and for all failing trials: using a sequential search algorithm.

80. A program product as defined in claim 74, further including means recorded on said medium for automatically diagnosing every failing module for each failing embedded test block following a test step, including performing one or more iterations of:

creating a new test step or modifying a current test step containing the embedded test block to be used for diagnosis;

generating ATE tester test patterns;

loading the ATE test patterns into the ATE tester, executing the ATE test patterns and returning circuit response data; and analyzing the circuit response data to determine whether additional information could be gathered by running the embedded test block in a different mode, or report the final result.

81. A system for use in testing or diagnosing an electronic system having embedded test controllers therein, comprising:

first means for creating information about the test capabilities of said test controllers in said electronic system;

second means for generating test and/or diagnostic instructions and data for said test controllers in said electronic system;

third means for applying said instructions and data to said test controllers and receiving test results therefrom; and fourth means for analyzing said result data and reporting characteristics of said electronic system.

82. A system as defined in claim 81, wherein said first means including:

means for describing access patterns and initialization patterns of operating modes of each said embedded test controllers;

means for describing features of said electronic system; and means for describing expected response data of said electronic system.

83. A system as defined in claim 81, said second means including:

means for reading the information created by said first means;

means for obtaining test and/or diagnostic requirements;

means for creating test and/or diagnostic instructions and data to achieve said requirements based on said information.

84. A system as defined in claim 81, said fourth means including:

means for reading the information created by said first means;

means for obtaining test and/or diagnostic requirements;

means for receiving test result data from said third means; and means for translating said result data into meaningful characteristics of said electronic system based on said information and said test and diagnostic requirements.

85. A system as defined in claim 81, said third means including:

means for receiving said test and diagnostic instructions and data;

means for sending said instructions and data to said embedded test controllers;

means for waiting for embedded test operations to complete; and means for receiving test result data from said embedded test controllers.

86. A system as defined in claim 81, said third means is an ATE.

87. A system as defined in claim 81, said third means is a computer with a communication port to connecting to said electronic system connected to an ATE for receiving power and clock signal therefrom.

88. A system as defined in claim 81, said third means is a computer with having a communications port, a cable connecting said port to said electronic system, a power supply and clock source.

89. A system as defined in claim 81, said third means is said electronic system itself.

90. A system as defined in claim 81, said electronic system being remote from said system for testing and/or diagnosing.

* * * * *